United States Patent
Ohmi et al.

(10) Patent No.: US 7,663,734 B2
(45) Date of Patent: Feb. 16, 2010

(54) PATTERN WRITING SYSTEM AND PATTERN WRITING METHOD

(75) Inventors: Tadahiro Ohmi, 1-17-301, Komegafukuro 2-chome, Aoba-ku, Sendai-shi, Miyagi, 980-0813 (JP); Shigetoshi Sugawa, Miyagi (JP); Kimio Yanagida, Fukushima (JP); Kiwamu Takehisa, Miyagi (JP)

(73) Assignee: Tadahiro Ohmi, Sendai-shi (JP)

( * ) Notice: Subject to any disclaimer, the term of this patent is extended or adjusted under 35 U.S.C. 154(b) by 504 days.

(21) Appl. No.: 10/552,731

(22) PCT Filed: Apr. 9, 2004

(86) PCT No.: PCT/JP2004/005134
§ 371 (c)(1), (2), (4) Date: Nov. 15, 2005

(87) PCT Pub. No.: WO2004/095549
PCT Pub. Date: Nov. 4, 2004

(65) Prior Publication Data
US 2006/0147841 A1 Jul. 6, 2006

(30) Foreign Application Priority Data

| Apr. 11, 2003 | (JP) | 2003-107776 |
| May 26, 2003 | (JP) | 2003-148362 |
| Oct. 14, 2003 | (JP) | 2003-353433 |
| Oct. 23, 2003 | (JP) | 2003-363460 |

(51) Int. Cl.
*G03B 27/54* (2006.01)
(52) U.S. Cl. .......................... 355/67; 355/53; 359/619
(58) Field of Classification Search .................. 355/53, 355/67; 359/619
See application file for complete search history.

(56) References Cited

U.S. PATENT DOCUMENTS

| 5,691,541 A * | 11/1997 | Ceglio et al. ............. 250/492.1 |
| 5,894,341 A | 4/1999 | Nishi et al. |
| 6,020,950 A | 2/2000 | Shiraishi |
| 6,049,555 A * | 4/2000 | Ohtsuka et al. .............. 372/34 |
| 6,229,639 B1 | 5/2001 | Ozarski |
| 6,233,035 B1 * | 5/2001 | Toshiyuki et al. ............. 355/22 |
| 6,285,488 B1 | 9/2001 | Sandstrom |
| 6,379,867 B1 * | 4/2002 | Mei et al. .................... 430/296 |
| 6,428,940 B1 | 8/2002 | Sandstrom |
| 6,486,938 B1 | 11/2002 | Morita |
| 6,552,308 B2 | 4/2003 | Nishimura |
| 6,816,302 B2 | 11/2004 | Sandstrom |
| 7,009,753 B2 | 3/2006 | Sandstrom |

(Continued)

FOREIGN PATENT DOCUMENTS

JP 62-21220 1/1987

(Continued)

*Primary Examiner*—Diane I Lee
*Assistant Examiner*—Steven H Whitesell-Gordon
(74) *Attorney, Agent, or Firm*—Foley & Lardner LLP

(57) ABSTRACT

In a pattern writing method for writing a pattern on a substrate by the use of projection patterns output from a mirror device including two-dimensionally arranged micromirrors, exposure is implemented by ON/OFF controlling each micromirror and partly overlapping the projection patterns from the mirror device at least in a one-dimensional direction, thereby accurately controlling the exposure of intermediate amounts of light.

2 Claims, 25 Drawing Sheets

U.S. PATENT DOCUMENTS

| | | |
|---|---|---|
| 7,034,986 B2 | 4/2006 | Sandstrom |
| 7,184,192 B2 | 2/2007 | Sandstrom |
| 2002/0097495 A1* | 7/2002 | Mei .......................... 359/618 |
| 2003/0001798 A1 | 1/2003 | Okuyama |
| 2003/0002040 A1* | 1/2003 | MacAulay et al. .......... 356/317 |
| 2003/0027367 A1* | 2/2003 | Watkins et al. ................ 438/16 |
| 2003/0214644 A1 | 11/2003 | Shirota |
| 2008/0079922 A1 | 4/2008 | Sandstrom |

FOREIGN PATENT DOCUMENTS

| | | |
|---|---|---|
| JP | 05-234846 A | 9/1993 |
| JP | 09-022120 A | 1/1997 |
| JP | 10-326737 | 12/1998 |
| JP | 2000-003856 A | 1/2000 |
| JP | 2001-013297 A | 1/2001 |
| JP | 2001-133893 A | 5/2001 |
| JP | 2002-083756 A | 3/2002 |
| JP | 2002-124451 A | 4/2002 |
| JP | 2002-520837 A | 7/2002 |
| JP | 2002-353095 A | 12/2002 |
| JP | 2002-372790 A | 12/2002 |
| JP | 2003-015309 | 1/2003 |
| JP | 2003-332221 | 11/2003 |
| WO | WO 97/43770 | 11/1997 |
| WO | WO 02/41196 A1 | 5/2002 |

* cited by examiner

FIG. 3

(a) FORMULAS

SPOT CENTER INTERVAL (D) = d · G

NUMBER OF SPOTS BETWEEN LINES (N) = (Y-1)/(G-1) ~ Y/G

LINE INTERVAL (S) = D · N

EFFECTIVE EXPOSURE WIDTH (W) = (X-2G) · S

NUMBER OF SCAN TIMES (m) = XM/W

SCAN SPEED (V) = D · f

WRITING TIME (T) = (YM/V) · m (b) EXPLANATION OF SYMBOLS

G : NUMBER OF GRADATIONS d : MINIMUM GRID SIZE ON SUBSTRATE (X, Y) : NUMBER OF MICROMIRROR PIXELS
(TRANSVERSE DIRECTION, LONGITUDINAL DIRECTION)

(XM, YM) : WRITING AREA IN SUBSTRATE
(TRANSVERSE DIRECTION, LONGITUDINAL DIRECTION)

f : MICROMIRROR DEFLECTION FREQUENCY (Hz)

(c) DESIGN EXAMPLE

G = 64 GRADATIONS d = 1.56nm

X = 2048, Y = 512

XM = 132mm, YM = 100mm f = 2,000Hz (d) CALCULATION RESULTS

D = 1.56nm × 64 = 0.10μm

N ~ 512/64 = 8

S = 0.10μm × 8 = 0.8μm

W = (2048 - 2 × 64) × 0.8μm = 1.536mm m = 132mm/1.536mm = 86 TIMES

V = 0.10 μm × 2,000 = 0.2mm/s

T = (100mm/0.2) × 86 = 43000s ~ 12h

FIG. 5
(a)
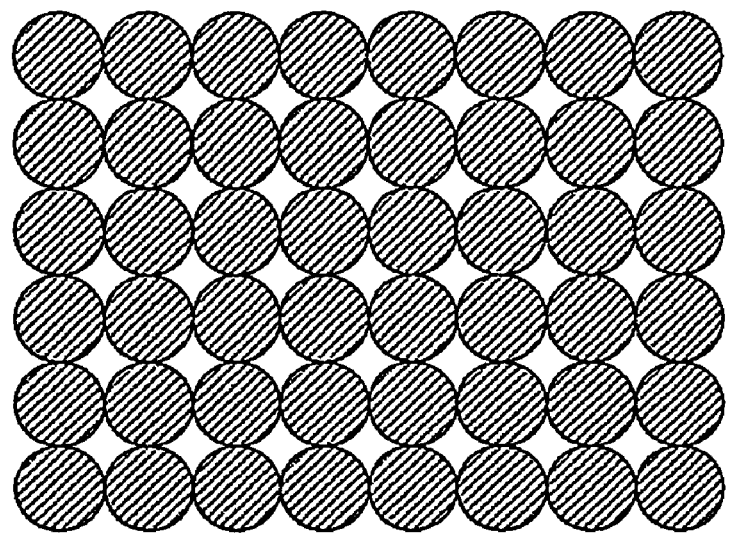
(b)
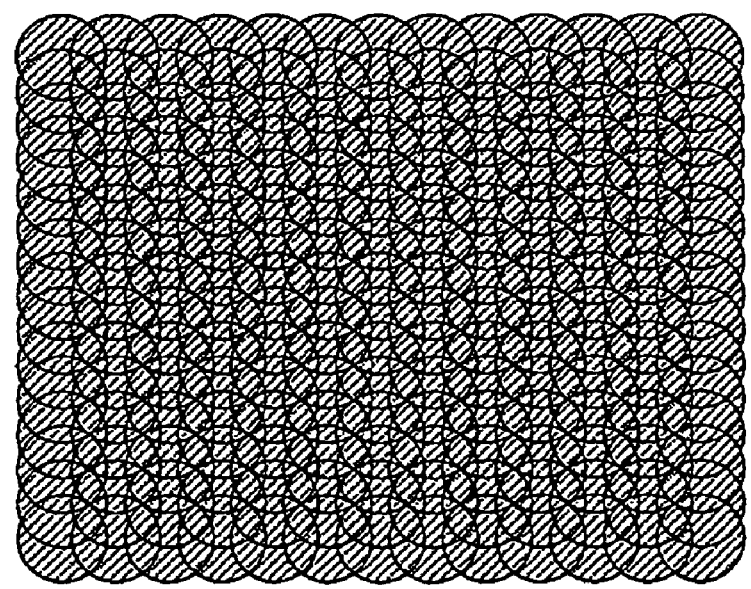

FIG. 8
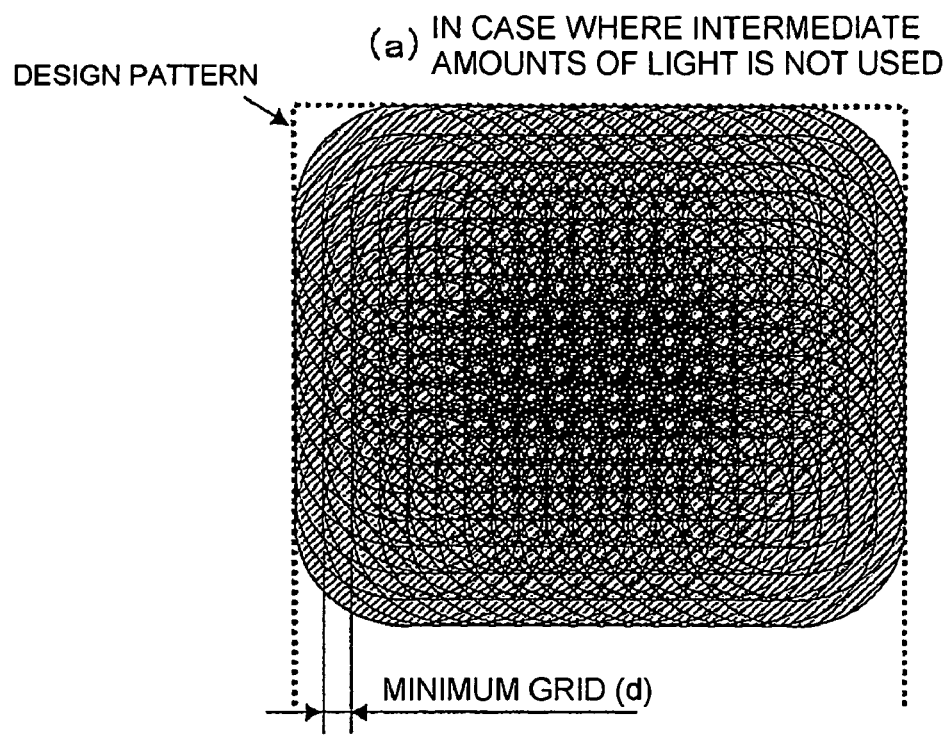
(a) IN CASE WHERE INTERMEDIATE AMOUNTS OF LIGHT IS NOT USED
DESIGN PATTERN
MINIMUM GRID (d)
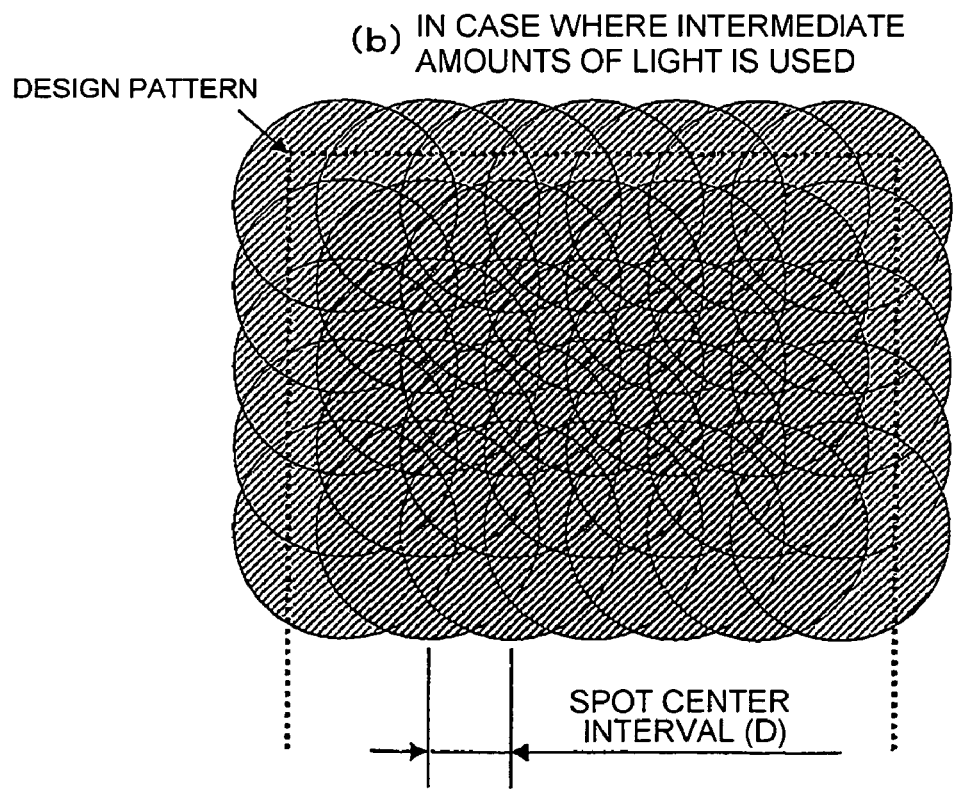
(b) IN CASE WHERE INTERMEDIATE AMOUNTS OF LIGHT IS USED
DESIGN PATTERN
SPOT CENTER INTERVAL (D)

FIG. 12
(a)
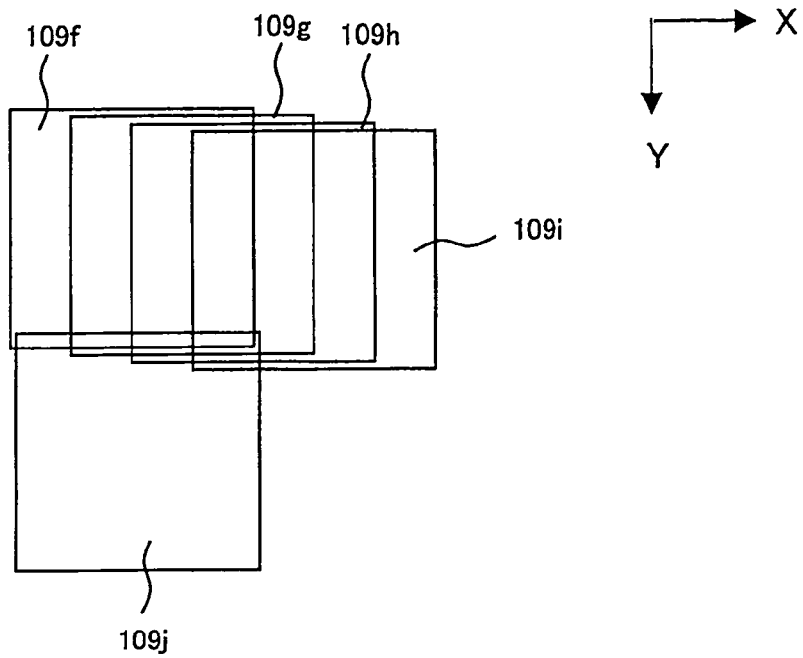
(b)
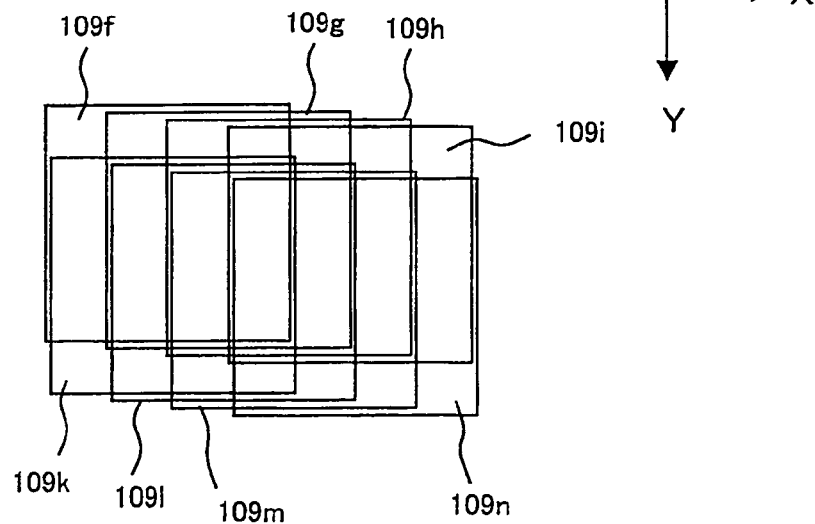

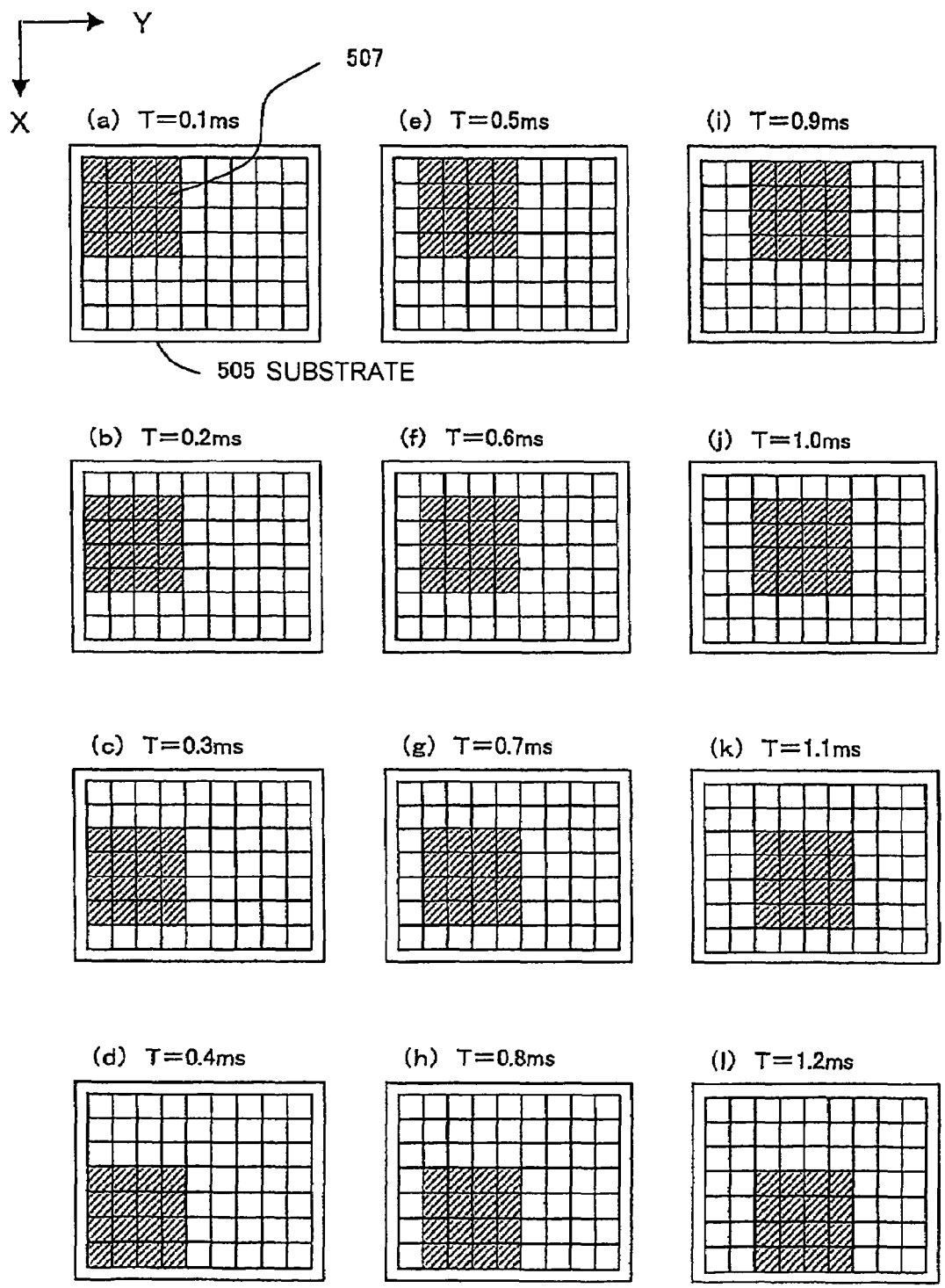

PATTERN WRITING SYSTEM AND PATTERN WRITING METHOD

TECHNICAL FIELD

This invention relates to a pattern writing system and a pattern writing method applicable to a maskless writing system for use in an exposure process, a mask writing system for use in fabricating a mask that is used in an exposure system, or the like on manufacturing a semiconductor integrated circuit.

BACKGROUND ART

Generally, in an exposure process on manufacturing a semiconductor integrated circuit, it is necessary to write a circuit pattern on a wafer applied with a resist by the use of a mask (it may also be called a reticle) with the circuit pattern written thereon (which is called pattern exposure), and a system therefor is called an exposure system or an exposure apparatus. However, there is also an exposure system for directly writing a circuit pattern on a wafer without using a mask (this system is called a maskless exposure system).

On the other hand, in order to fabricate a mask, it is necessary to deposit, on the surface of a quartz plate or the like which will serve as a substrate of the mask, a chromium film or the like for shielding that is patterned to allow exposure light to pass through a pattern corresponding to an intended circuit pattern or an object circuit pattern. This chromium film or the like is patterned by pattern exposure and a system therefor is called a mask writing system. The technique of the mask writing system is generally electron-beam writing using an electron beam and a system therefor is called an electron-beam writing system (hereinafter referred to as an EB writing system).

In addition to the EB writing system, there is also an alternate mask writing system (sometimes called a laser-beam writing system), which has been manufactured and sold as a product and which is based on a technique that performs pattern writing (i.e. pattern exposure with respect to a mask substrate coated with a resist) by the use of laser light in the ultraviolet region (hereinafter abbreviated as ultraviolet laser light).

As the writing system of this type, there has conventionally been proposed a laser-beam writing system that uses a reflector display element (a mirror device called a digital micromirror or the like) having a large number of micromirrors arranged two-dimensionally and performs pattern writing on a mask substrate by irradiating ultraviolet laser light onto the reflector display element and by controlling reflected light into a pattern. This laser-beam writing system can expose a partial pattern of a circuit pattern at one time and therefore has a high processing speed, as known in the art. Description is given about this, for example, in Proceedings of SPIE, Vol. 4186, PP. 16-21 or U.S. Pat. No. 6,428,940.

According to the above-mentioned documents, the conventional laser-beam writing system uses the mirror device composed of about one million (about 500×about 2000) micromirrors each of which has a size of about 16 microns. This is projected onto the mask substrate at a reduced size of 1/160 through a reduction-projection optical system. As a result, a pattern corresponding to each micromirror becomes a square with a side of 0.1 microns, i.e. 100 nm. On the other hand, when writing a mask, the minimum size in design is generally small like 1 to 4 nm, which is called a minimum grid. Therefore, in order to realize a pattern shape that is far smaller than the mirror-projected pattern with the side of 100 nm, it is performed to change an amount of light irradiated onto a pattern to be projected. For example, according to the foregoing document, the amount of light is changed in 64 levels (using intermediate amounts of light), thereby adapting to a minimum grid of 1.56 nm being 1/64 of 100 nm.

In the conventional technique of adapting to the minimum grid having the size smaller than the reduction-projected pattern of each micromirror by the use of the intermediate amounts of light as described above, a deflection angle of each micromirror in the mirror device is controlled, thereby changing the intensity of laser light to be projected. In this connection, if exposure is performed by moving the micromirror to be projected (i.e. scanning the mask substrate) per minimum grid of 1.56 nm, the scan speed is reduced to 1/64 while the number of scan times increases 64 times, and therefore, a writing time is extremely prolonged like 64×64 times. That is, it is essential to use the intermediate amounts of light in order to shorten the writing time in the laser-beam writing system.

DISCLOSURE OF THE INVENTION

In the conventional technique of controlling the mirror deflection angle for achieving the intermediate amounts of light as described above, it is necessary to accurately control a voltage applied to each micromirror. However, in order to change the intermediate amount of light in 64 levels as described above, the voltage should be controlled so as to be exactly divided into 64 levels and, further, it has been difficult to accurately control all voltages of as many as about one million micromirrors within a time that is at least one-to-several of a short time of not more than 0.0005 seconds corresponding to a laser repetition rate of 2000 Hz. As a result, there are those instances where the voltage actually applied cannot be accurately controlled in 64 levels to thereby cause variation so that the amount of light can be substantially controlled only in several levels.

It is an object of this invention to provide a pattern writing system using a mirror device, which can use intermediate amounts of light without controlling a voltage applied to each micromirror by the use of intermediate values thereof.

It is another object of this invention to provide a member that can realize the foregoing intermediate amounts of light and a pattern writing system having such a member.

It is still another object of this invention to provide a pattern writing method that can realize intermediate amounts of light only by ON/OFF controlling each micromirror of a mirror device.

Means for Solving the Problem

For accomplishing the foregoing objects, it is configured such that a pattern projecting apparatus is included that can project a pattern in the form of an aggregate of a large number of spots by the use of two-dimensionally arranged light control elements such as a mirror device and a microlens array and, by relatively moving a substrate obliquely with respect to an array of the large number of spots in the pattern projected onto the substrate from the pattern projecting apparatus, some of the spots in the patterns caused by irradiation at different times are irradiated so as to overlap each other at the same position on the substrate. Herein, the substrate is a wafer in the case where a maskless exposure system is constituted by this invention, while, is a mask substrate in the case where a mask writing system is constituted thereby.

According thereto, since a single spot position can be exposed by a plurality of times of irradiation, it is possible to achieve an intermediate amount of light by controlling the number of times of overlapping irradiation. Therefore, a control voltage for each micromirror requires only two levels of ON and OFF so that a voltage control does not become difficult. Since the diameter of each spot can be set smaller than the spot interval by the foregoing microlens and further since the substrate is moved obliquely, it is possible to control the intermediate amount of light by controlling the number of times of irradiation to the same position on the substrate as described above.

BRIEF DESCRIPTION OF THE DRAWINGS

FIG. 3 is a diagram for explaining a writing time calculation method according to this invention.

FIGS. 5a and 5b are diagrams for explaining pattern writing.

FIG. 8, (a) and (b) are diagrams respectively showing the case where use is not made of intermediate amounts of light according to this invention and the case where use is made of intermediate amounts of light according to this invention.

FIG. 12, (a) and (b) are diagrams each for explaining an example of the pattern writing method according to this invention.

FIG. 25 is a diagram for explaining a technique of realizing a gray scale in this invention.

BEST MODE FOR CARRYING OUT THE INVENTION

Figure 1:
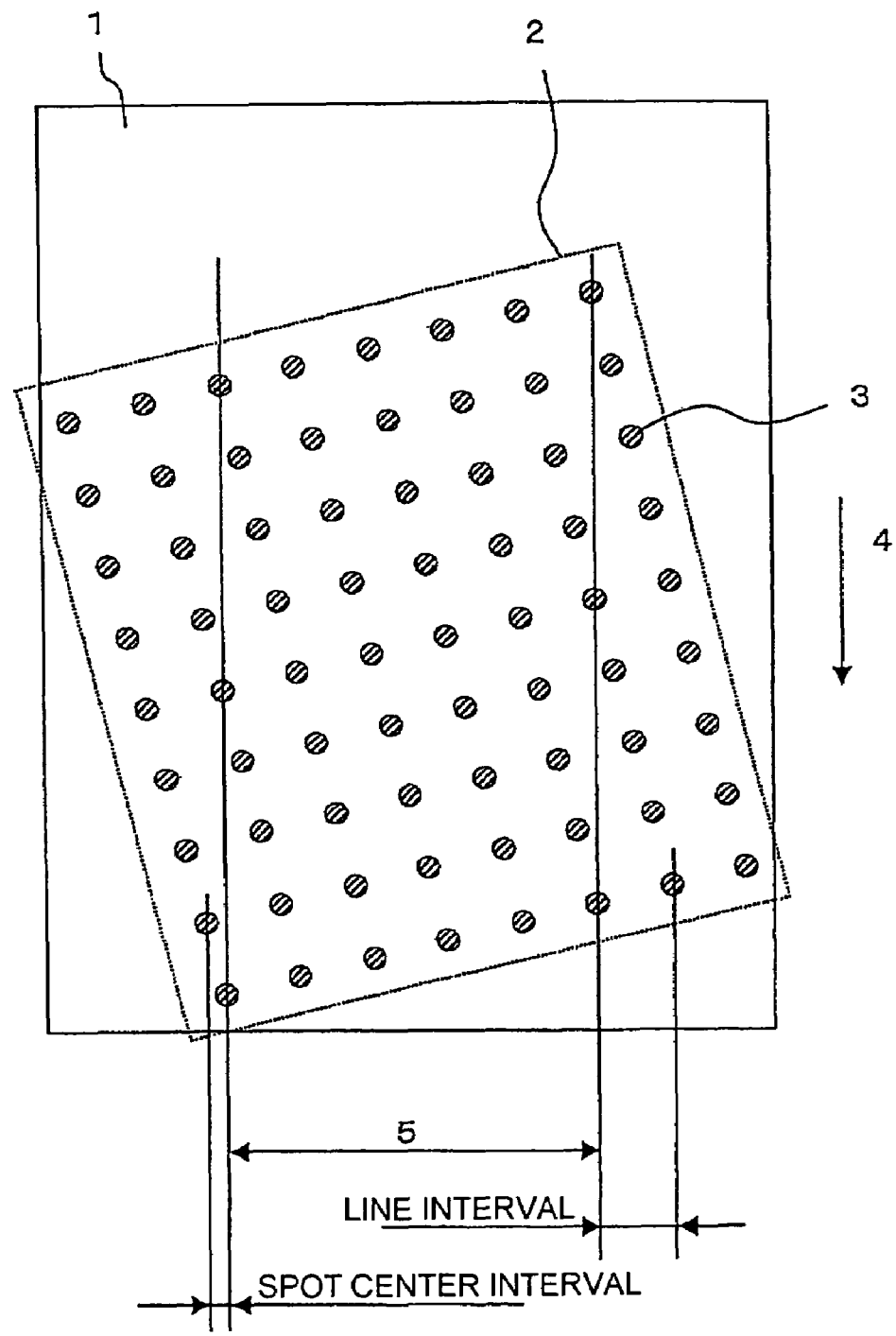
FIG. 1 is an explanatory diagram of a first example according to a first embodiment of this invention.
Figure 2:
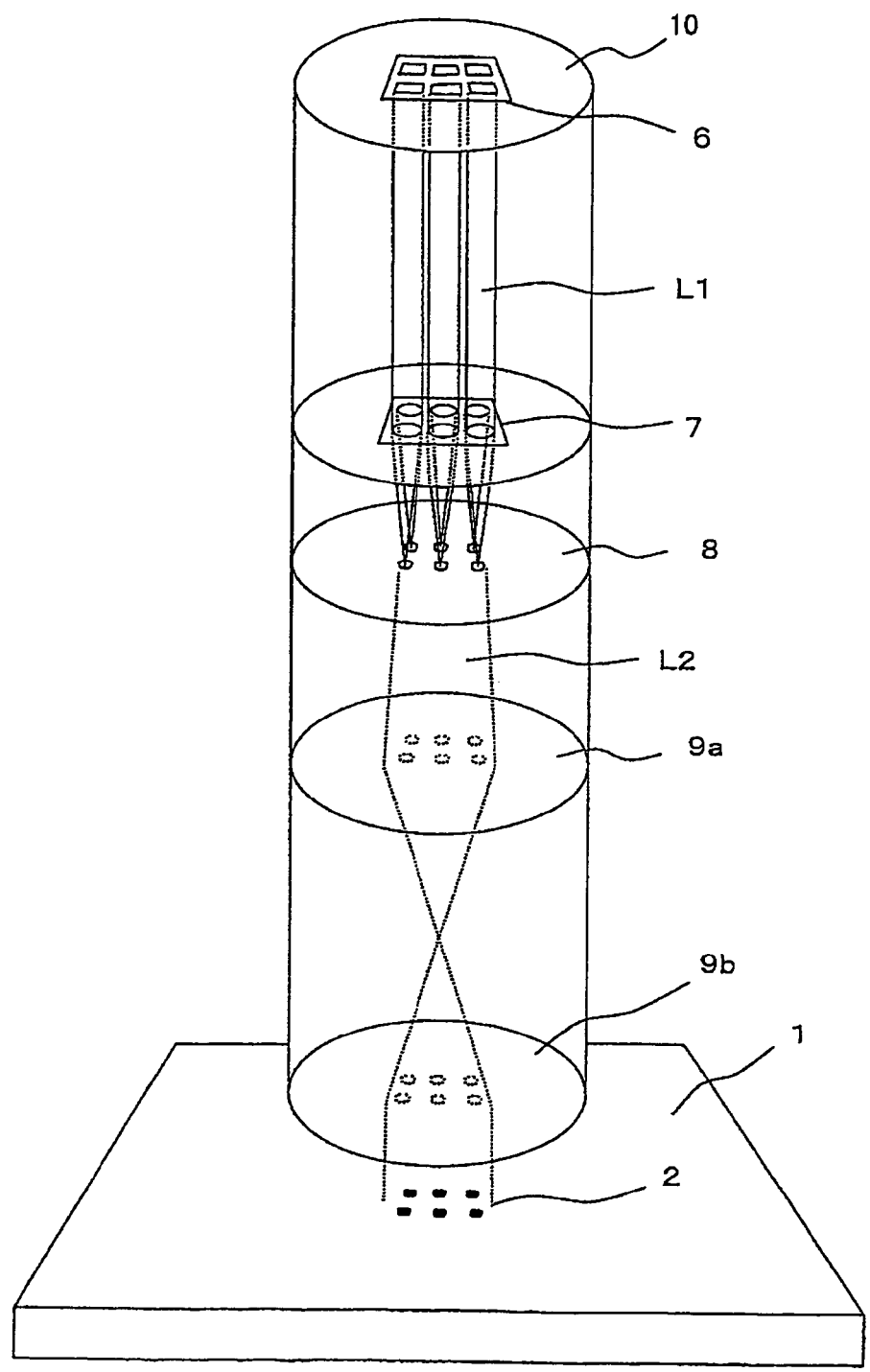
FIG. 2 is a structural diagram of a pattern projecting apparatus in the first example of this invention.

Referring to FIGS. 1 and 2, description will be made about a first example according to a first embodiment of this invention. FIG. 1 is an explanatory diagram of describing a writing operation by a pattern writing system 100 as the first example of this invention and FIG. 2 is a structural diagram of describing a pattern projecting apparatus 10 forming part of the pattern writing system 100. As shown in FIG. 2, the pattern projecting apparatus 10 uses a mirror device 6 operable as a light control element of a type arranged two-dimensionally. Although schematically illustrated in FIG. 2, 2048×512 (i.e. about one million) micromirrors are actually arranged longitudinally and transversely at about a 16-micron pitch. Laser light L1 proceeding from the mirror device 6 passes through a microlens array 7 so as to be converged into small spots and then given to a pinhole plate 8. Further, laser light L2 exiting through holes of the pinhole plate 8 passes through lenses 9a and 9b so as to be projected onto a substrate 1. The lenses 9a and 9b constitute a projection optical system and serve to project an optical image at the position of the pinhole 8 onto the substrate 1. With this configuration, as shown in FIG. 1, an aggregate pattern in the form of mutually spaced-apart spots is projected onto a mirror device projection area 2 in the substrate 1.

In this invention, as shown in FIG. 1, the mirror device projection area 2 defining the contour of the aggregate of the spots 3 arranged in a longitudinal and transverse matrix is disposed obliquely with respect to the substrate 1, i.e. with respect to a moving direction 4 of the substrate 1. In other words, rows or columns of the aggregate pattern of the spots 3 arranged in the matrix are disposed obliquely with respect to the moving direction of the substrate 1. In this state, the substrate 1 is moved along the moving direction 4 during pattern exposure. In this event, among the spots 3 located within an effective exposure width 5, a plurality of the spots 3 overlap each other at the same position on the substrate 1. That is, when observing the substrate 1 from the moving direction 4, a plurality of the spots 3 are located at the same coordinate position with respect to the transverse direction and, therefore, when these plurality of spots 3 move in the moving direction 4, they overlap each other at the same position.

In the example of FIG. 1, there is illustrated a case where three spots 3 overlap each other at the same position. The aggregate of the spots 3 illustrated in FIG. 1 is formed in an instant by one-time irradiation (one shot), but, when irradiation is carried out every time the substrate 1 is moved by a length of about a half the diameter of the spot 3, this makes it possible to cover the whole surface of the substrate 1 with connected spots.

When such irradiation is carried out in the example shown in FIG. 1, all the spots can overlap three times within the effective exposure width 5 in the substrate 1 by adjusting the moving speed of the substrate 1 so that three spots come to (i.e. are exposed at) the same position on the substrate 1. In this invention, this is utilized so that, only by controlling the number of times of irradiation of each spot onto the substrate 1 (i.e. selective control of directing or not directing laser light toward the substrate 1 by the mirror device 6), the amount of exposure can be controlled in three levels (four levels when no irradiation is included) at the position of each spot.

Practically, since the actual mirror device 6 has 2048×512 micromirrors, it is possible to arrange spots so that, for example, 64 spots are irradiated at the same position and, therefore, the amount of exposure can be controlled in 64 levels at each spot. Using this as the number of gradations, a writing time of, for example, a 132×100 mm writing area in the substrate is calculated by formulas shown in FIG. 3, (a). Explanation of symbols in (a) is shown in (b). As shown in (c) as a design example, when the number of modulations (frequency) of the mirror device is set to 2000 Hz while a minimum grid d on the substrate is set to 1.56 nm, the substrate may be moved so that the spot comes substantially per 1.56× 64=100 nm and, consequently, the calculation result is obtained as shown in (d) wherein the writing time becomes about 12 hours.

On the other hand, assuming that the intermediate amounts of light are not used, necessity arises to move the substrate so that the spot comes per minimum grid over the whole writing area, which requires the spots at $0.132 \times 0.100/(1.56 \text{ nm}^2) = 5.42 \times 10^{15}$ different positions. Accordingly, even when 2048×512 micromirrors are operated at 2000 Hz, the writing time becomes 718 hours and becomes about 60 times as compared with the case of using the intermediate amounts of light.

As described above, in the pattern writing system of this invention, since the intermediate amounts of light are used, not only the substrate can be written at high speed but also it is not necessary to control the voltage of each micromirror as conventionally required and, therefore, the control technique for the mirror device becomes simple so that malfunction or adjustment failure hardly occurs, thereby enabling to accurately achieve the gradations.

Figure 4:
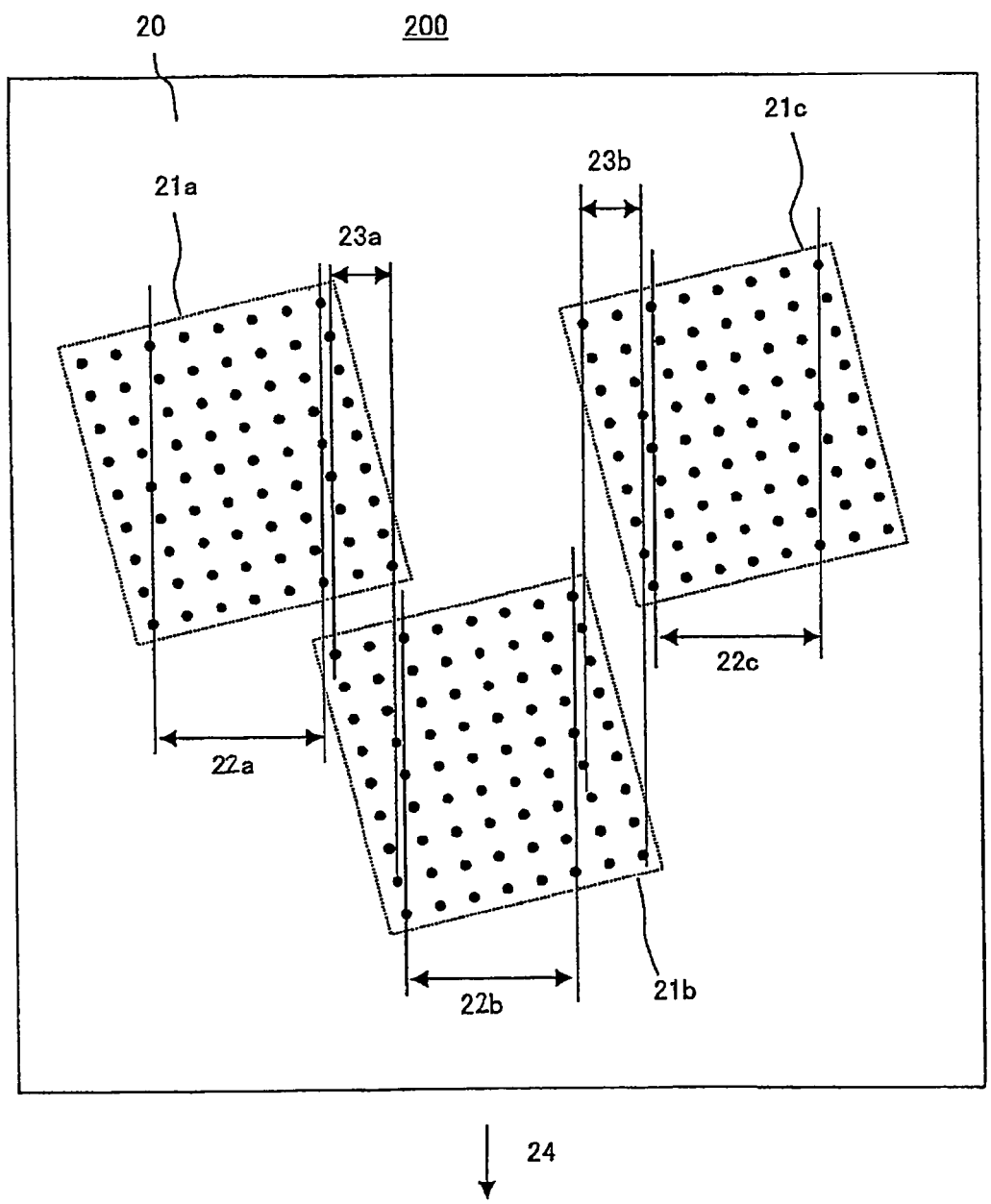
FIG. 4 is an explanatory diagram of a second example according to the first embodiment of this invention.

Now, referring to FIG. 4, description will be made about another example of a pattern writing system of this invention. FIG. 4 is an explanatory diagram of describing pattern writing by a pattern writing system 200 having non-illustrated three pattern projecting apparatuses. In mirror device projection areas 21a, 21b, and 21c projected onto a substrate 20 from the three pattern projecting apparatuses, intermediate amounts of light in the set number of gradations can be achieved in effective exposure areas 22a, 22b, and 22c by moving the substrate 20, but, in the other areas, the set number of gradations cannot be satisfied. Taking this into account, the three pattern projecting apparatuses are disposed so that the exposure areas with less than the set number of gradations overlap each other. By this, when the substrate 21 is moved along a moving direction 24, since the two mirror device projection areas overlap each other even in each of insufficient gradation number areas 23a and 23b, it is possible to overlap spots one another times equal to the set number of gradations.

On the other hand, as a problem of the case where the exposure is performed by the pattern projecting apparatus 10 capable of projecting the pattern in the form of the aggregate of the large number of spots as described above, when a large number of spots, each having a circular shape, are exposed close to each other, the exposure cannot be achieved at portions left between the spots as shown in FIG. 5, (a). Therefore, it is necessary to perform the exposure so that the adjacent spots overlap each other as shown in (b). As a result of that, it often happens that unevenness of exposure takes place, even when no intermediate amounts of light are used. This is because the number of overlapping times of the spots differs from one another in dependency upon positions.

Figure 6:
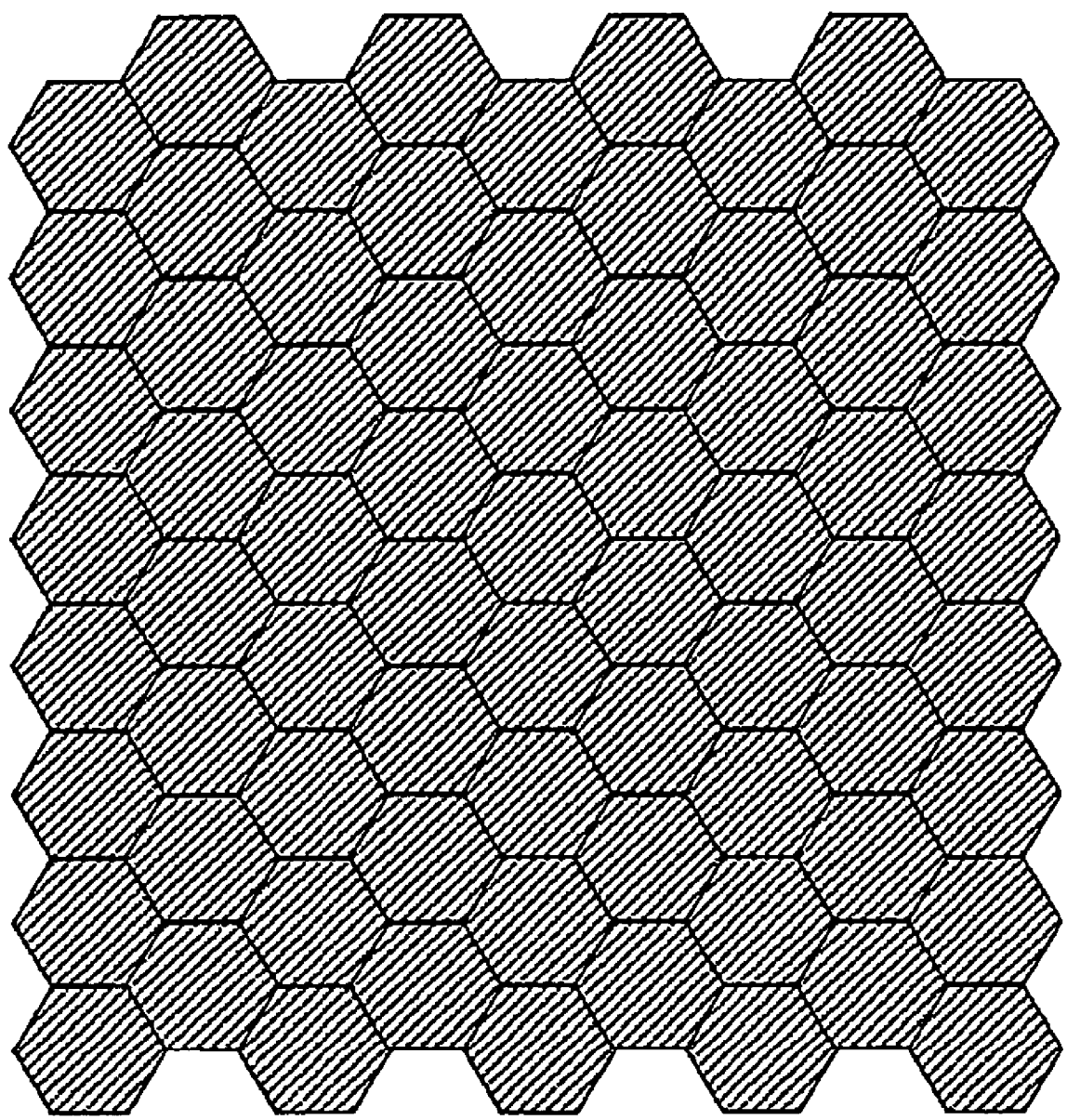
FIG. 6 is a diagram for explaining pattern writing according to this invention.

In view of this, the spot shape may be set to a hexagonal shape. According to this, as shown in FIG. 6, it is possible to cover the whole surface with the same number of spot times when hexagonal spots are arranged close to each other. Further, when providing an intermediate amount of light by performing exposure with a plurality of shots at the same position, the number of shots can be easily controlled. In order to realize the hexagonal spots, the holes of the pinhole plate 8 in the pattern projecting apparatus 10 shown in FIG. 2 may each be set to a hexagonal shape, for example. Although the hexagonal shape is shown in FIG. 6, an octagonal shape may be replaced.

Figure 7:
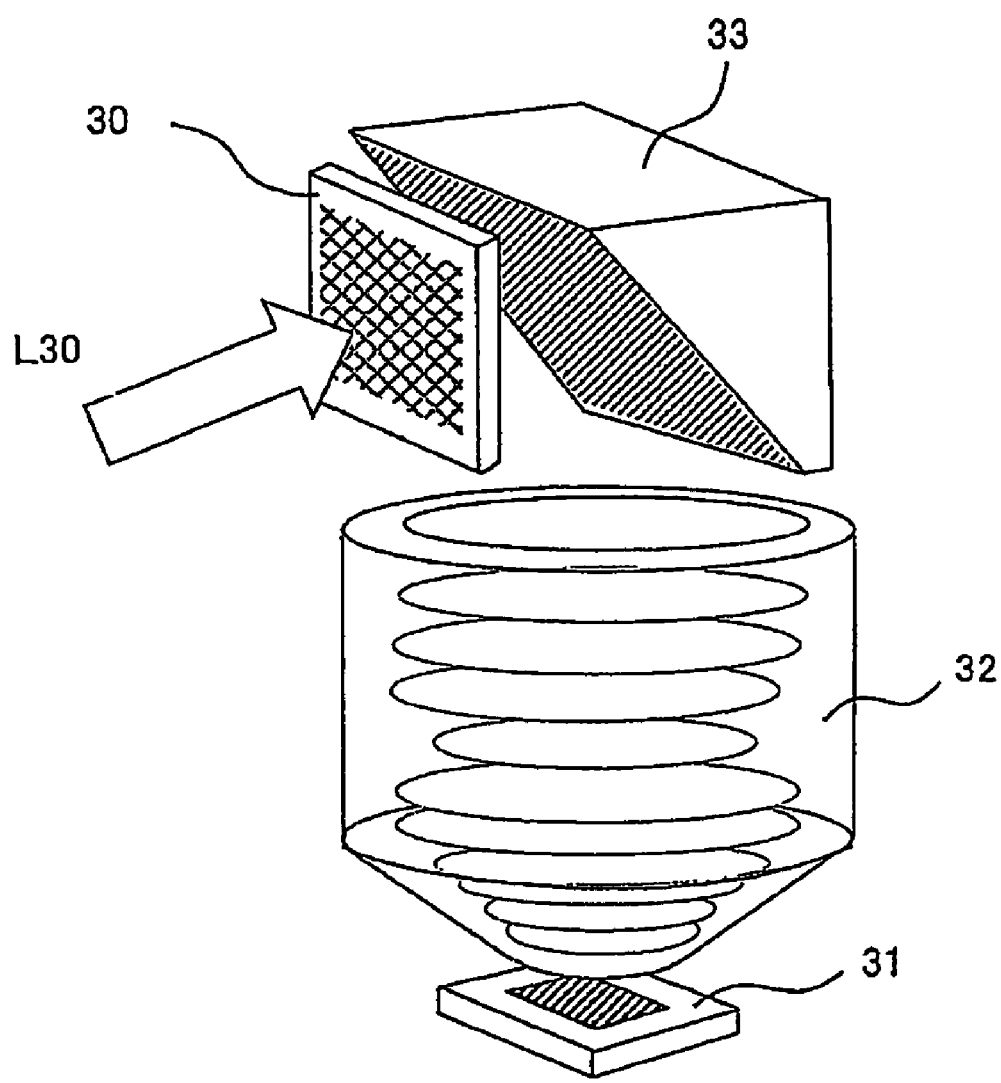
FIG. 7 is a structural diagram of a mask writing system using a large-size mask written by a pattern writing system of this invention.

Now, referring to FIG. 7, description will be made about an example using a substrate written by the pattern writing system 100 shown in FIG. 2. A mask writing system 300 shown in FIG. 7 is a system that uses a large-size mask 30 written by the pattern writing system 100, thereby writing a mask for a general exposure system on a mask substrate 31. That is, a pattern written on the large-size mask 30 having a size equal to several times that of a normal mask is transferred onto the mask substrate 31 through a reduction-projection optical system 32. Since the large-size mask 30 is larger and heavier than the normal mask, the former is fixed vertically in order to avoid deflection due to its self-weight. Therefore, a 45-degree reflector 33 is used and, by this, part of laser light L30 irradiated onto the large-size mask 30, which passes through the large-size mask 30, is reflected by the 45-degree reflector 33 and passes through the reduction-projection optical system 32 so as to be irradiated onto the mask substrate 31.

In this example, the pattern writing system of this invention is used for writing the large-size mask 30 for use in writing the normal mask. The effect thereof is that, as described before, the pattern writing system of this invention can, by the use of the intermediate amounts of light, not only implement the pattern writing with high accuracy but also implement the pattern writing at very high speed. Therefore, a writing time does not become incredibly long even for the large-size mask 30.

Herein, referring to FIG. 8, description will be made about a difference in pattern writing time depending on the use or non-use of the intermediate amounts of light according to this invention. In the case where use is not made of the intermediate amounts of light, it is necessary to irradiate an exposure spot per minimum grid (d) in design as shown in (a) and, therefore, when the writing area is given as S, the number of spots becomes $S/d^2$ (times). On the other hand, when use is made of the intermediate amounts of light, the spot interval can be increased the number of gradations (G) times the minimum grid (d) as shown in (b). As a result, although the number of spots in the writing area S apparently seems to be $S/(G \cdot d)^2$, since these spots all overlap G times at maximum, the total number of spots becomes $S/(G \cdot d)^2 \times G = S/d^2/G$. That is, since it is 1/G of the number of spots shown in (a), the writing time can be shortened to 1/the number of gradations.

Figure 9:
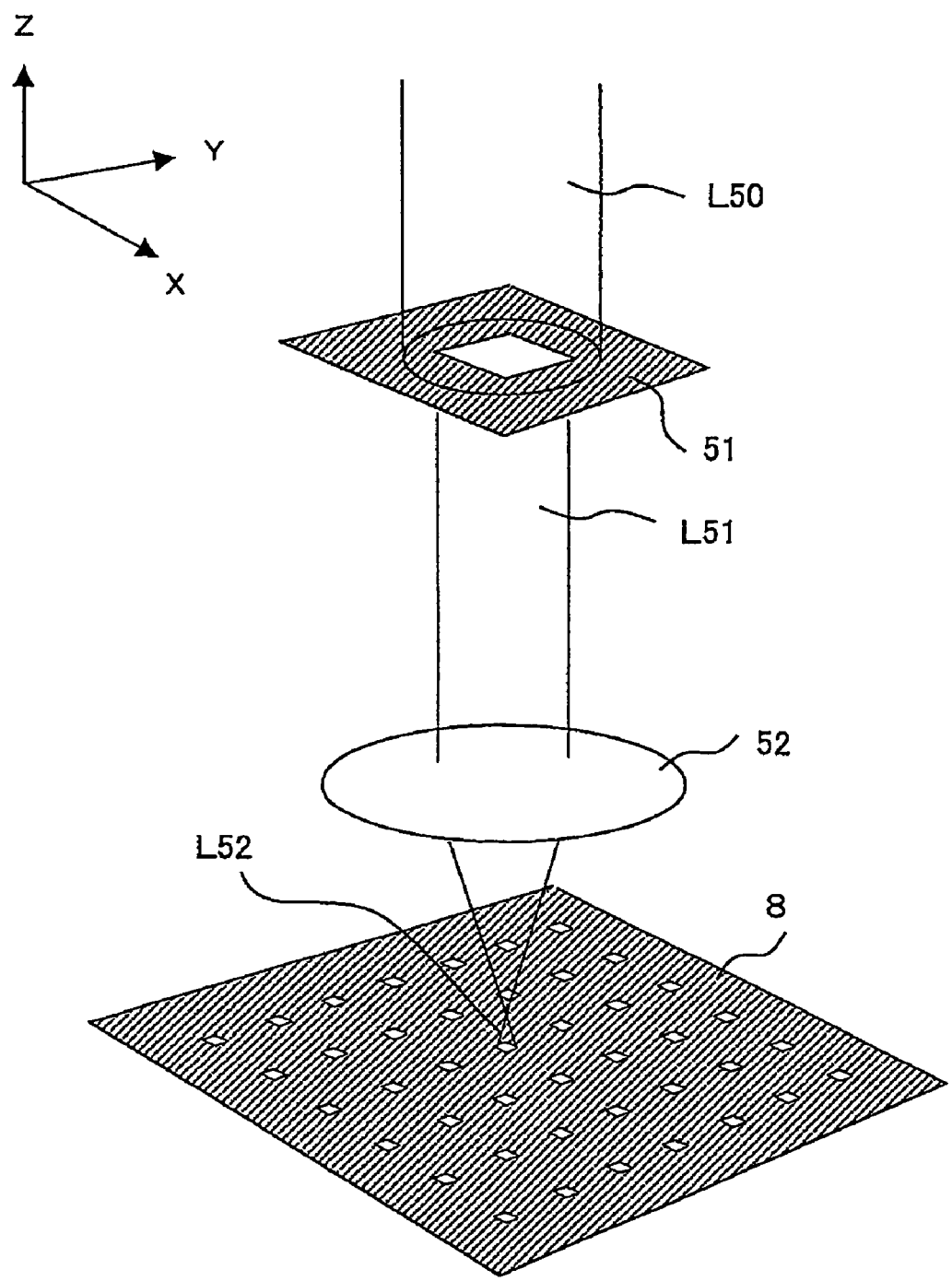
FIG. 9 is a diagram for explaining one example of a method of manufacturing a pinhole plate for use in the pattern projecting apparatus shown in FIG. 2.

FIG. 9 shows one example of a method of manufacturing the pinhole plate 8 in the pattern projecting apparatus 100 shown in FIG. 2. Herein, the case is shown where square holes are formed in the pinhole plate 8 by laser light. Laser light L50 from a non-illustrated excimer laser irradiates a metal mask 51 having a square hole. Laser light L51 having passed through the hole of the metal mask 51 passes through a condenser lens 52 to irradiates the pinhole plate 8. The condenser lens 52 forms a reduction-projection optical system so as to reduction-project an image at the position of the metal mask 51 onto the pinhole plate 8. By this, laser light L52 irradiated onto the pinhole plate 8 becomes a small square so that a square hole is formed.

The pinhole plate 8 is placed on a non-illustrated XY stage and is thereby scanned in X-direction and stepped in Y-direction in the figure. Therefore, a large number of square holes are formed in the pinhole plate 8 by the laser light L50 performing repetitive pulse operation.

In this example, the excimer laser is used for the perforation. The reason is that the wavelength of the excimer laser is short and thus the reflectance on the metal surface becomes low to thereby facilitate the processing of the metal plate and, further, since the pulse width is short like about 10 ns, even when laser irradiation is implemented while continuously moving the pinhole plate 8, the distance of the movement within the time of the pulse width can be set small like several nm or less. As a result, the square hole is not undesirably extended.

As a usable laser, it may be, other than the excimer laser, a laser such as a fluorine laser or a femtosecond laser that is excellent in metal processing performance and capable of repetitive operation. Further, in the foregoing example, the description has been made about the case where the substrate is moved along the moving direction. However, the mirror device projection area may be moved obliquely with respect to the substrate.

Figure 10:
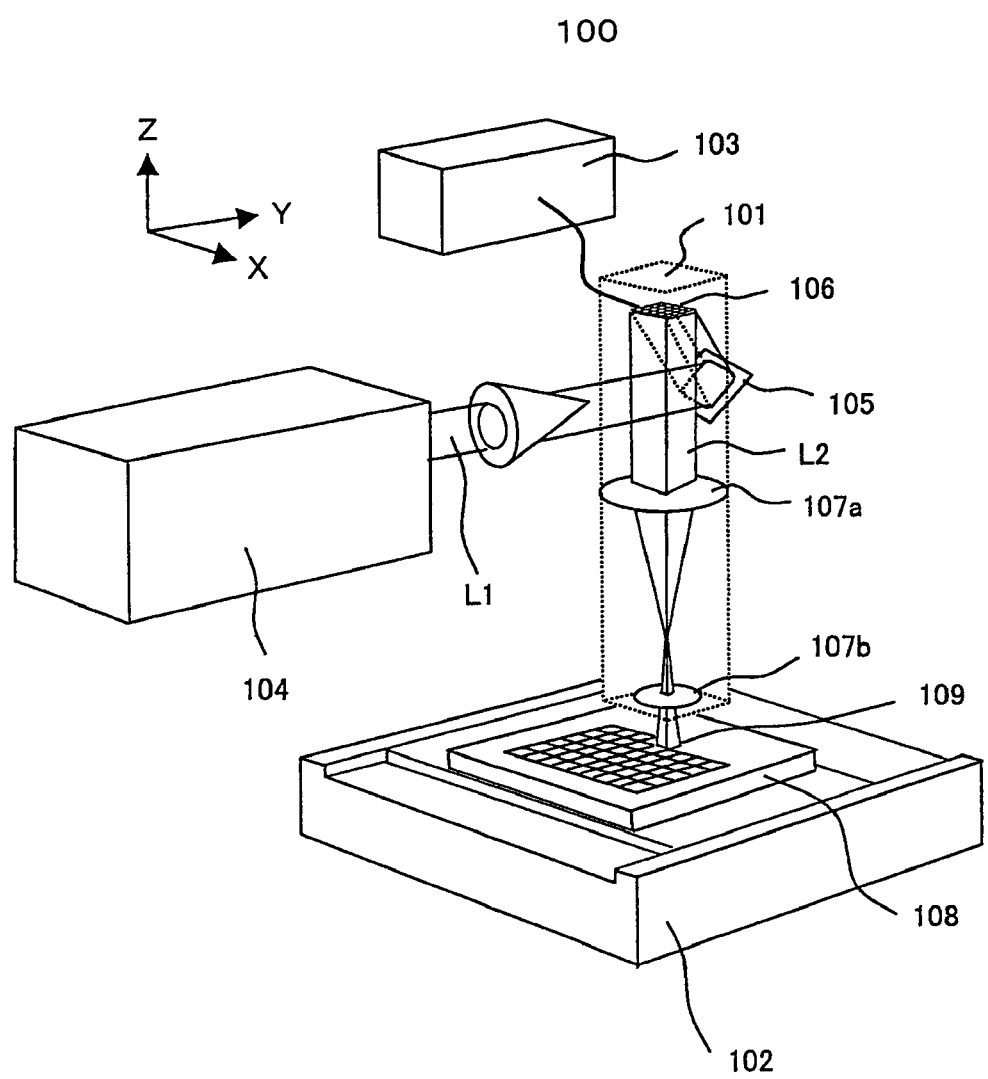
FIG. 10 is a structural diagram of a pattern writing system in a first example according to a second embodiment of this invention.
Figure 11:
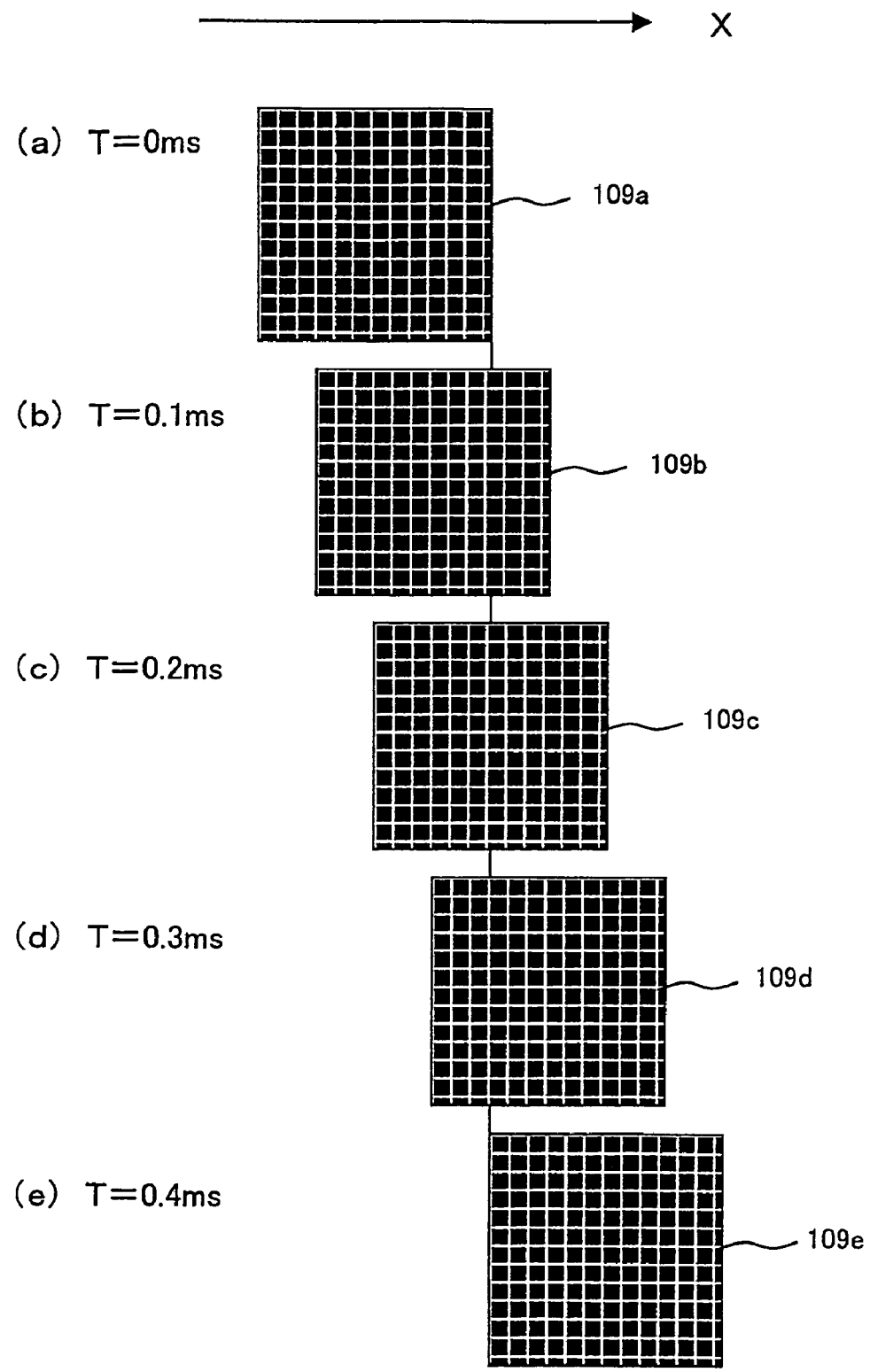
FIG. 11 is a diagram for explaining a pattern writing method according to this invention.

Referring to FIGS. 10 and 11, description will be made about a first example according to a second embodiment of this invention. FIG. 10 is a structural diagram of describing a pattern writing system 100 as the first example of this invention while FIG. 11 is an explanatory diagram of describing a pattern writing method by the pattern writing system 100.

The pattern writing system 100 shown in FIG. 10 mainly comprises a mask pattern projecting portion 101, an XY stage 102, a mask pattern data output device 103, and a wavelength-conversion solid-state laser 104 serving as an ultraviolet light source. The wavelength-conversion solid-state laser 104 uses the third harmonic of a YAG laser that implements repetitive pulse operation at 10000 Hz and pulse laser light L1 with a wavelength of 355 nm is extracted therefrom. The laser light L1 enters the mask pattern projecting portion 101 and is reflected by a mirror 105 so as to be incident upon a mirror device 106 in the form of two-dimensionally arranged micromirrors. In the mirror device 106, the 2048×512 (i.e. about one million) micromirrors are herein arranged longitudinally and transversely at about a 16-micron pitch. In the mirror device 106, the deflection angle of each micromirror is controlled at a frame rate of 10000 Hz by the mask pattern data output device 103 and, in this invention, is controlled only in two directions (i.e. ON/OFF controlled). By this, what proceeds in a direction for use in exposure becomes laser light L2. The laser light L2 proceeds through lenses 107a and 107b so as to be transferred onto a mask substrate 108 as a projection pattern 109. That is, the lenses 107a and 107b form a reduction-projection optical system so as to reduction-project the plane of the mirror device 106 onto the mask substrate 108 applied with an i-line resist. The mask substrate 108 is placed on the XY stage 102 so that the projection pattern 109 can be moved over the whole area on the mask substrate 108, thereby enabling pattern writing over the whole surface of the mask substrate 108.

When transferring the pattern on the mirror device 106 onto the mask substrate 108, the writing method as shown in FIG. 11 is used in this invention. FIG. 11 shows, in time sequence, the state of moving the projection pattern 109 in X-direction in FIG. 10. In the pattern writing system 100, since, as described above, the pattern on the mirror device 106 is controlled at 10000 Hz frames, a new pattern is projected onto the mask substrate 108 per 0.1 ms. Therefore, FIG. 11, (a), (b), (c), (d), and (e) show positions of projection patterns 109 (109a, 109b, 109c, 109d, and 109e in sequence) per 0.1 ms. That is, the pattern projected onto the mask substrate 108 due to generation of the pulse laser light L1 moves a quarter of the size (width in X-direction) of the projection pattern per 0.1 ms. The movement of the projection pattern 109 is carried out by the movement of the mask substrate 108 caused by the XY stage 102.

As described above, in this example, the projection patterns overlap each other by three quarters of the area between frames and therefore the projection patterns overlap four times over the whole surface of the mask substrate 108. Therefore, four gradations can be obtained. Although, in this example, the case of four gradations is shown in the figure in order to facilitate the explanation, it is preferable to actually provide, for example, about 50 gradations where about 49/50 of the area overlaps between frames. This is because it can reduce the minimum grid to about several nm.

In this example, since the repetition rate of the wavelength-conversion solid-state laser 104 serving as the light source is 10000 Hz, pulses generated correspond to the frames of the mirror device 106, respectively. On the other hand, the wavelength-conversion solid-state laser 104, i.e. the light source, may be operated at a higher repetition rate, but is preferably operated at a repetition rate that is integer times the number of frames of the mirror device 106. For example, when operating the wavelength-conversion solid-state laser 104 at 20000 Hz, two pulses of laser light may be irradiated with respect to each frame in the mirror device 106. According to this, since a plurality of pulse lights are supplied with respect to the same pattern, there is an effect that an adverse effect due to variation in pulse energy is relaxed (i.e. averaged).

Now, referring to FIG. 12, description will be made about movement in Y-direction of the projection pattern 109 in the pattern writing method for the mask substrate 108 in this embodiment shown in FIG. 10. FIG. 12, (a) illustrates only the contour of the projection pattern 109, shown in FIG. 10, per frame. Since the projection patterns overlap each other between frames as shown in FIG. 11, FIG. 12 illustrates four continuous projection patterns 109f, 109g, 109h, and 109i so as to be slightly offset from each other in Y-direction, but, actually, they may be located at the same position in Y-direction. When scanning is finished once in X-direction during projection onto a large-size mask, stepping is performed once in Y-direction and then scanning is performed again in X-direction. As a result, as shown in FIG. 12, (a), a pattern projected adjacent to the projection pattern 109f is a projection pattern 109j which slightly overlaps the edge of 109f.

On the other hand, as shown in FIG. 12, (b), patterns to be projected adjacent to four projection patterns 109f, 109g, 109h, and 109i after one step may be projected so as to largely overlap them, respectively, i.e. may overlap them by three quarters like projection patterns 109k, 109l, 109m, and 109n. According to this, as a result of the overlapping by three quarters both in X-direction and in Y-direction, upon finishing the projection over the whole surface of the mask substrate 108, the overlapping is carried out 16 times at all the positions so that 16 gradations can be obtained. By overlapping in the two, i.e. X- and Y-directions as described above, it is possible to reduce abnormal exposure caused by joint connection errors after stepping.

Figure 13:
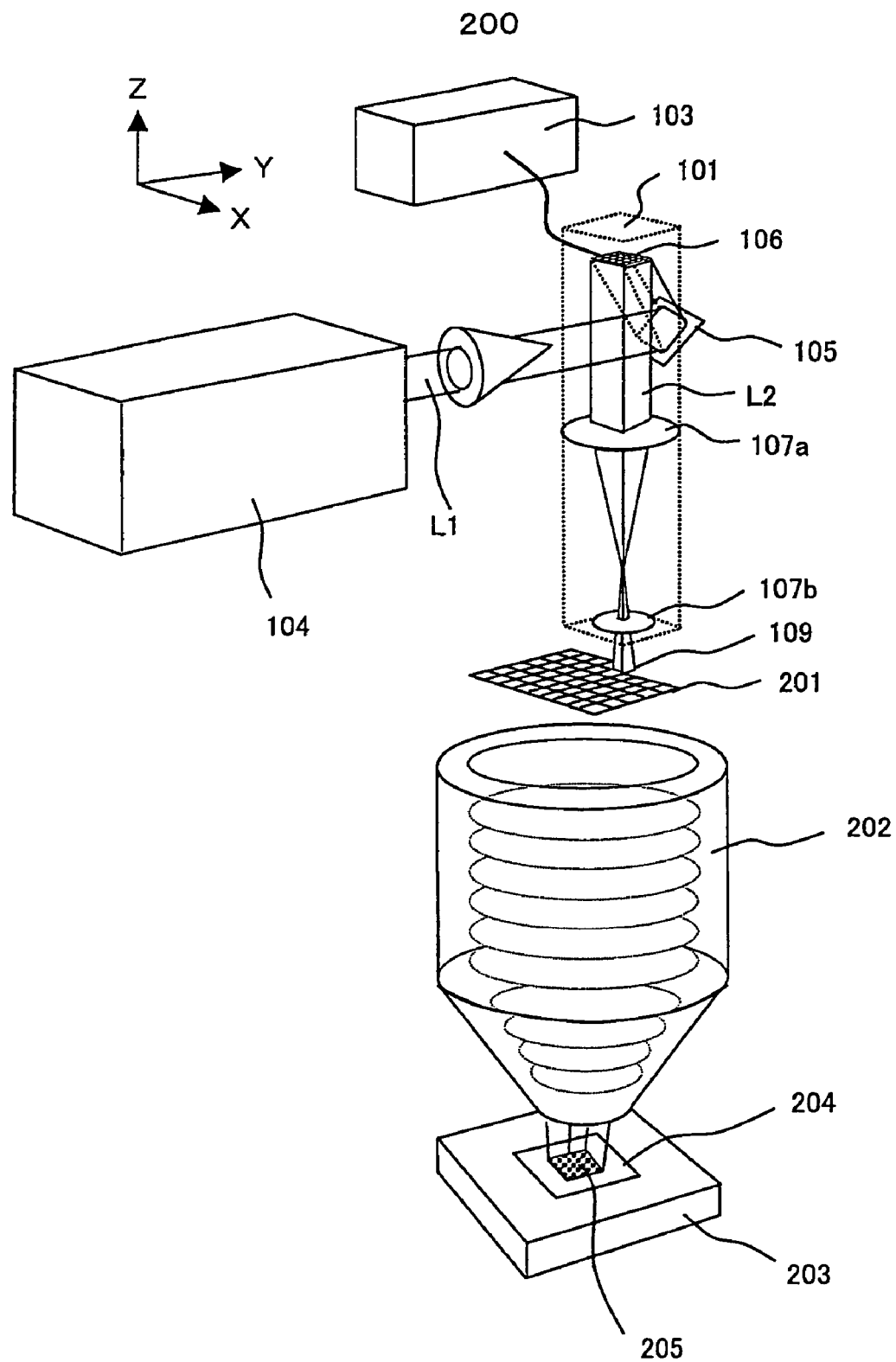
FIG. 13 is a diagram showing a structure of a pattern writing system in a second example according to the second embodiment of this invention.

Now, referring to FIG. 13, description will be made about a second example according to the second embodiment of this invention. A pattern writing system 200 of this invention shown in FIG. 13 comprises a mask pattern projecting portion 101, a mask pattern data output device 103, and a wavelength-conversion solid-state laser 104 serving as an ultraviolet light source which are the same as the components of the pattern writing system 100 of the first example shown in FIG. 10. However, this system does not directly write a mask by the mask pattern projecting portion 101 but implements pattern writing on an intermediate mask 201 and, based on this, forms a mask pattern 205 on a mask substrate 204 placed on an XY stage 203 through a reduction-projection optical system 202. In this example, use is made of the writing method as shown in FIG. 11 by the use of the mask pattern projecting portion 101 like that in the first example and, as a result, the intermediate mask 201 is written at high speed. As a feature of this example, since the mask pattern 205 actually transferred onto the mask substrate 204 can be reduced in size to about 1/4 as compared with the intermediate mask 201, it is particularly suitable for writing a 1:1 mask or the like.

Figure 14:
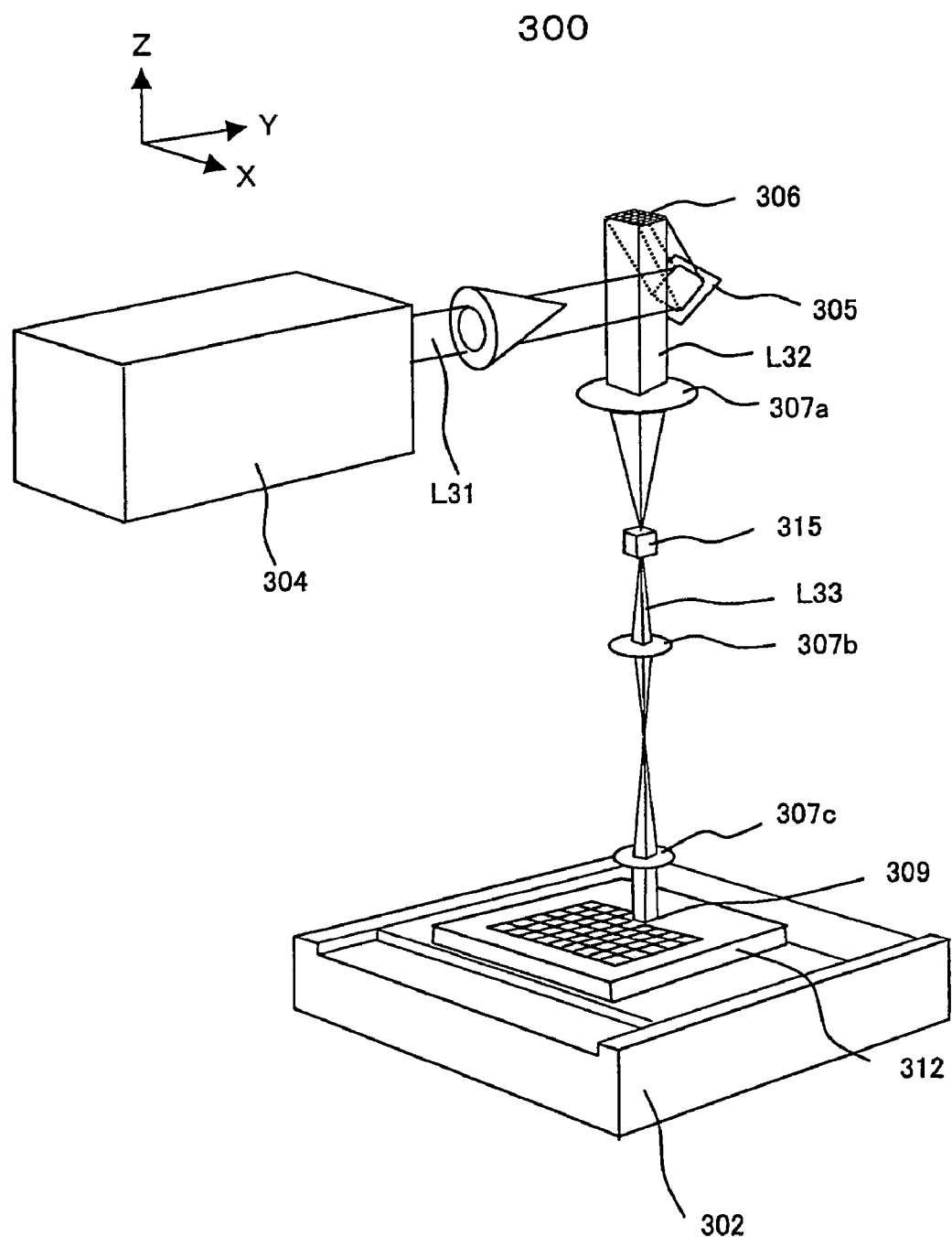
FIG. 14 is a diagram showing a structure of a pattern writing system in a third example according to the second embodiment of this invention.

Now, referring to FIG. 14, description will be made about a third example according to the second embodiment of this invention. In FIG. 14, a pattern writing system 300 of this invention has a structure similar to that of the pattern writing system 100 of the first example shown in FIG. 10, but a wavelength-conversion solid-state laser device 304 used as a light source is a device that produces the second harmonic of a YAG laser. Therefore, laser light L31 extracted from the laser device 304 is green laser light having a wavelength of 532 nm. The laser light L31 is reflected by a mirror 305 to hit a mirror device 306 and then laser light L32 to be used for exposure proceeds downward so as to be incident upon a lens 307a. As a result, since the laser light L32 is condensed on a wavelength conversion element 315, there is produced laser light L33 with a wavelength of 266 nm in the ultraviolet region being the second harmonic of the laser light L31. The laser light L33 passes through lenses 307b and 307c and hits a mask substrate 312 applied with a KrF resist to form a projection pattern 309. The projection pattern 309 is a pattern in the wavelength conversion element 315 that is projected on an enlarged scale while a pattern of the mirror device 306 is reduction-projected in the wavelength conversion element 315. Therefore, the projection pattern 309 is the reduction-projected pattern of the mirror device 306.

As a feature of this example, there is an effect that since the visible-region laser device is used as the wavelength-conversion solid-state laser device 304 being the light source, the mirror device 306 is difficult to degrade. That is, as one of problems of a laser-beam writing system using a mirror device, there has conventionally been degradation of the mirror device in a short-term period due to irradiation of ultraviolet laser light. On the contrary, in this example, the mirror device 306 hardly degrades.

On the other hand, a copper vapor laser may be used instead of the wavelength-conversion solid-state laser device 304 being the light source in this example. It is known that the copper vapor laser can produce laser light with the high average output at a wavelength of 510.6 nm at a high repetition rate of 5000 to 30000 Hz. Accordingly, by using it as a light source, laser light L33 with a wavelength of 255.3 nm in the ultraviolet region can be produced through the wavelength conversion element 315. Therefore, the mask substrate 312 applied with the KrF resist can be exposed more efficiently. This is because there are many KrF resists that reveal the best properties at a wavelength of 248 nm of a KrF excimer laser and the second harmonic of the copper vapor laser like in this example is closer in wavelength to 248 nm than the second harmonic of the YAG laser.

Now, referring to FIG. 15, description will be made about another example according to the second embodiment of this invention.

Figure 15:
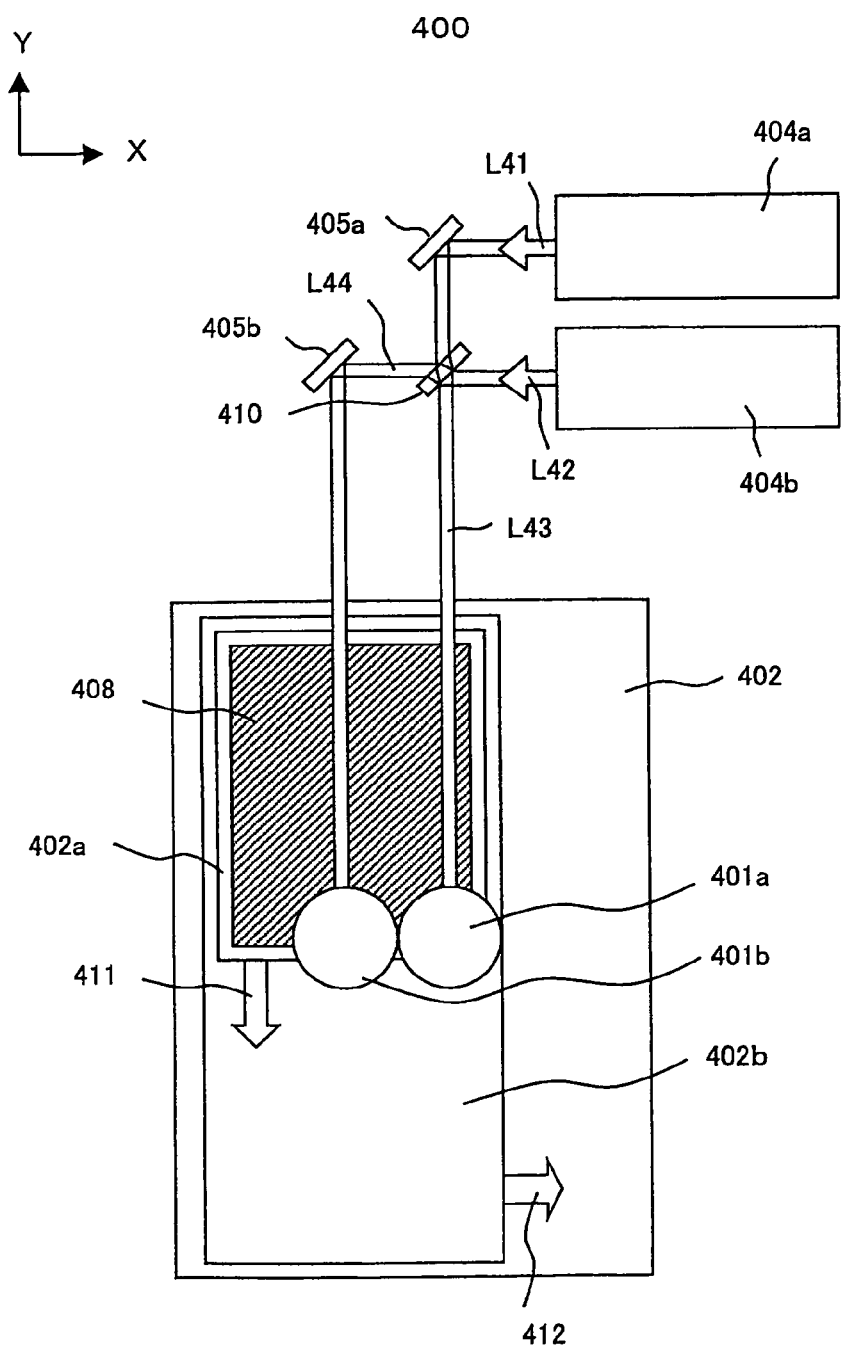
FIG. 15 is a diagram showing a structure of a pattern writing system in a fourth example of this invention.

FIG. 15 is a structural diagram, as seen from above, of a pattern writing system 400 of this invention.

The pattern writing system 400 uses two ultraviolet lasers as light sources, which are wavelength-conversion solid-state lasers 404a and 404b, respectively. The wavelength-conversion solid-state lasers 404a and 404b are configured to produce pulse laser lights of the same energy at a wavelength of 355 nm at a repetition rate of 10000 Hz at the same timing by synchronous operation. Laser light L41 extracted from the wavelength-conversion solid-state laser 404a is reflected by a mirror 405a so as to be incident upon a beam splitter 410. On the other hand, laser light L42 extracted from the wavelength-conversion solid-state laser 404b is also incident upon the beam splitter 410.

The beam splitter 410 has a reflectance and a transmittance that are each substantially 50% and the laser light with the wavelength of 355 nm is incident upon the beam splitter 410 at an angle of 45 degrees. Therefore, laser light L43 and laser light L44 proceeding from the beam splitter 410 each have the average power. The laser light L43 is supplied to a mask pattern projecting portion 401a while the laser light L44 is reflected by a mirror 405b and then supplied to a mask pattern projecting portion 401b. Since a structure of each of the mask pattern projecting portions 401a and 401b is the same as that of the mask pattern projecting portion 101 of the first example shown in FIG. 10, detailed explanation thereof is omitted.

On the other hand, a mask substrate 408 indicated by hatching, which is subjected to pattern writing by the mask pattern projecting portions 401a and 401b, is placed on a Y-stage platen 402a in an XY stage 402 and, as indicated by an arrow 411, is configured to be scan-movable in Y-direction. Further, the Y-stage platen 402a is placed on an X-stage platen 402b and, as indicated by an arrow 412, is configured to be step-movable in X-direction. That is, by the scan-movement of the Y-stage platen 402a and the step-movement of the X-stage platen 402b, it is possible to write the whole surface of the mask substrate 408.

A feature of this example resides in that the two pulse lasers (i.e. the wavelength-conversion solid-state lasers 404a and 404b) are used as the ultraviolet light sources and the two laser lights formed by passing the extracted laser lights through the beam splitter (or a half mirror) are used for the exposure. As a result, pulse energy variation in the two pulse lasers can be averaged and, therefore, energy variation of the pulse laser lights supplied to the mask pattern projecting portions 401a and 401b is smaller than the pulse energy variation of the wavelength-conversion solid-state lasers 404a and 404b. Thus, more uniform exposure can be implemented.

In the example shown in FIG. 15, the case is shown where the number of the ultraviolet light sources and the number of the mask pattern projecting portions are both two. However, each number may be larger and, for example, can take a value of four. In this case, although three beam splitters are required, there is an effect of further reducing the pulse energy variation.

The reduction in pulse energy variation provides not only the effect of enabling the uniform exposure, but also an effect of solving a problem such that, conventionally, when the variation is large, multiple exposure is required, i.e. since scanning is performed many times at the same position, the total time required for the exposure increases.

Now, referring to FIGS. 16 and 17, description will be made about two alternative examples of pattern writing systems according to the second embodiment of this invention.

Figure 16:
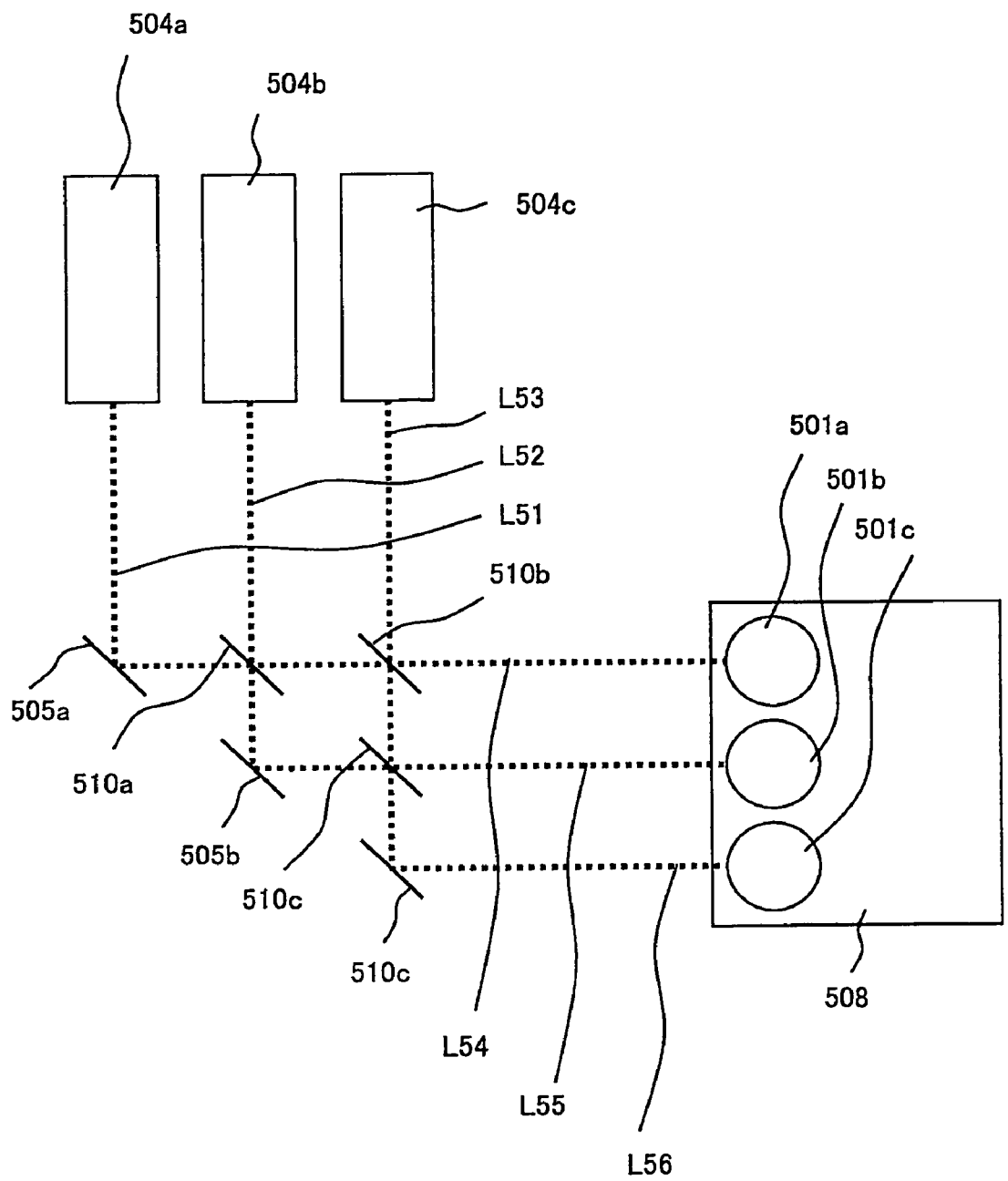
FIG. 16 is a diagram showing a structure of a pattern writing system in a fifth example of this invention.
Figure 17:
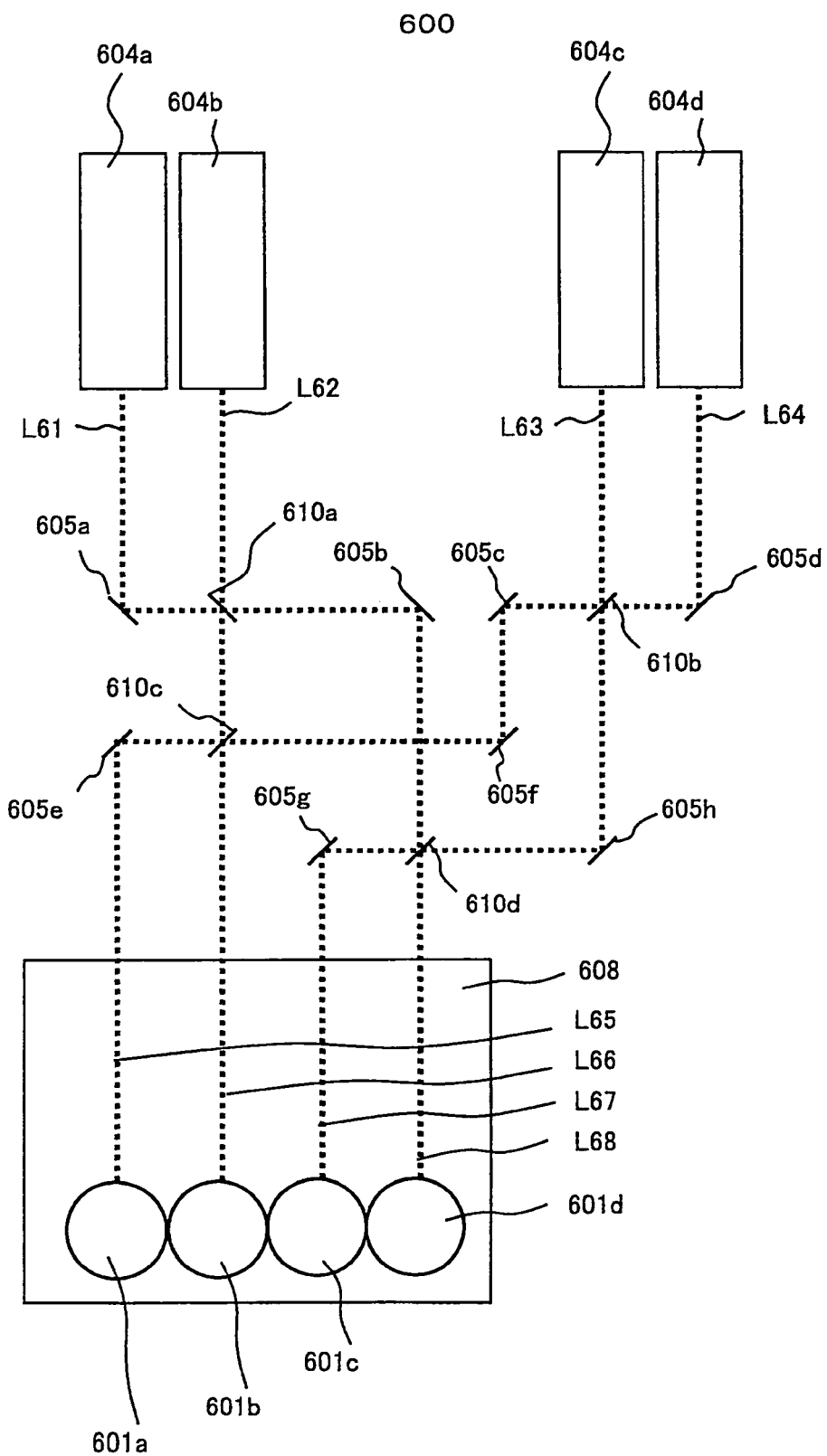
FIG. 17 is a diagram showing a structure of a pattern writing system in a sixth example of this invention.

FIG. 16 is a structural diagram, as seen from above, of a pattern writing system 500 and FIG. 17 is a structural diagram, as seen from above, of a pattern writing system 600. Each example has a structure using a plurality of light sources like the example shown in FIG. 15, wherein FIG. 16 relates mainly to a laser light synthesizing technique for the case of using three light sources while FIG. 17 relates mainly to a laser light synthesizing technique for the case of using four light sources. Since stages for driving mask substrates 508 and 608 are each the same as that in FIG. 15 and since mask pattern projecting portions 501a, 501b, 501 c, 601a, 601b, 601c, and 601d each have the same structure as that in FIG. 10, explanation thereof is omitted herein.

In the pattern writing system 500 shown in FIG. 16, three pulse laser devices 504a, 504b, and 504c are used as light sources.

Wavelength-conversion solid-state lasers, wavelength-conversion copper vapor lasers, or the like are preferable as those laser devices. Ultraviolet laser lights L51, L52, and L53 respectively extracted from the pulse laser devices 504a, 504b, and 504c proceed along dotted lines in the figure. The laser light L51 is reflected by a mirror 505a and incident upon a beam splitter 510a having a reflectance of 50% so as to be halved into transmission and reflection. The laser light L51 transmitted through the beam splitter 510a is incident upon a beam splitter 510b having a transmittance of about 66.7%. By this, about 33.3% (=50%×66.7%) of the original energy of the laser light L51 proceeds as laser light L54.

On the other hand, 50% of the original energy of the laser light L51 reflected by the beam splitter 510a is reflected by a mirror 505b and then incident upon a beam splitter 510c having a reflectance of 50%. On the other hand, about 16.7% (=50%×33.3%) of the original energy of the laser light L51 reflected by the beam splitter 510b is also incident upon the beam splitter 510c. Accordingly, the laser light L51 proceeding rightward in the figure from the beam splitter 510c as laser light L55 becomes 33.3% (=16.7%×50%+50%×50%) of the original energy.

Consequently, the laser light L51 is included by about 33.3% in each of the laser lights L54, L55, and L56. Likewise, the laser lights L52 and L53 are each also included by about 33.3%. Accordingly, since the pulse energy in each of the laser lights L54, L55, and L56 becomes the average value of the respective pulse energies of the laser lights L51, L52, and L53, the pulse energy variation is reduced.

Now, description will be made about the structure of the pattern writing system 600 shown in FIG. 17. Laser lights L61, L62, L63, and L64 respectively extracted from four pulse laser devices 604a, 604b, 604c, and 604d used in the pattern writing system 600 are subjected to repetition of division and synthesis by many mirrors 605a to 605h and four beam splitters 610a, 610b, 610c, and 610d as shown in the figure so that four laser lights L65, L66, L67, and L68 are produced. In this example, the four beam splitters 610a, 610b, 610c, and 610d each have a reflectance of 50% (transmittance of 50%) and the laser lights L61, L62, L63, and L64 are each incident upon the beam splitters twice, and therefore, all the laser lights are each reduced to 1/4 energy and distributed to the four beams. Therefore, the four laser lights L65, L66, L67, and L68 respectively include the same energies of the laser lights L61, L62, L63, and L64, i.e. the energies are averaged, the energy variation in the laser lights L61, L62, L63, and L64 is reduced to half or less.

With respect to the beam splitter used for dividing and synthesizing the plurality of laser lights extracted from the plurality of pulse laser devices in each of the examples shown in FIGS. 15, 16, and 17, use is made of the type that splits the light into reflection and transmission at a specific rate hardly depending on a polarization direction of the incident light. However, for example, as generally called a polarization beam splitter, use may be made of the type where the reflectance (or transmittance) largely differs with respect to a polarization direction of laser light. Particularly in wavelength-conversion lasers, since linearly polarized light is often used as extracted light, it is also possible to synthesize two beams into a single beam by the use of a polarization beam splitter.

According thereto, since a single laser light can be produced from two pulse laser devices, pulse energy variation can be reduced even in the case of a single mask pattern projecting portion. Likewise, it is also possible to supply two laser lights to two mask pattern projecting portions by the use of four pulse laser devices.

Figure 18:
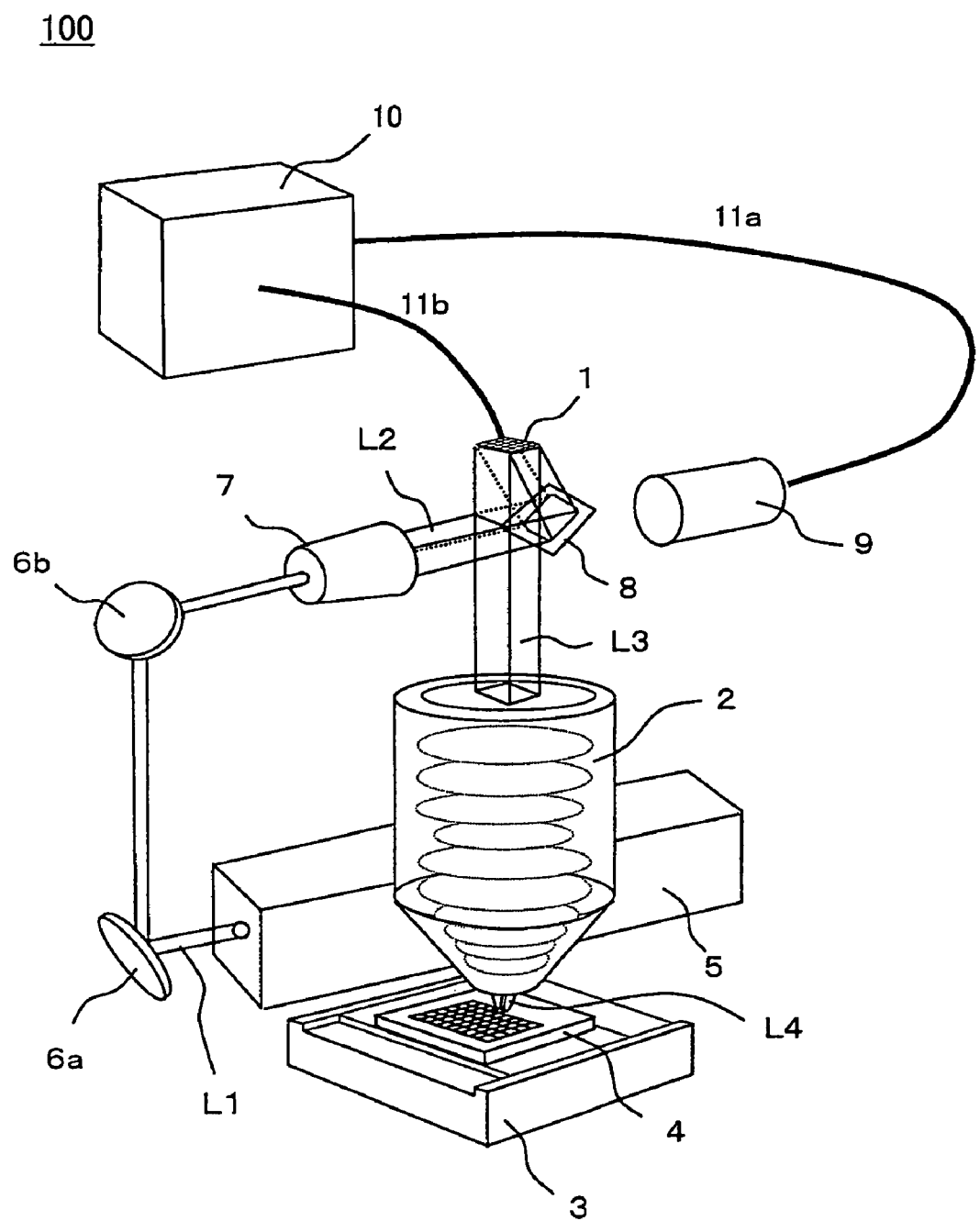
FIG. 18 is a diagram showing a structure of a pattern writing system in an example according to a third embodiment of this invention.
Figure 19:
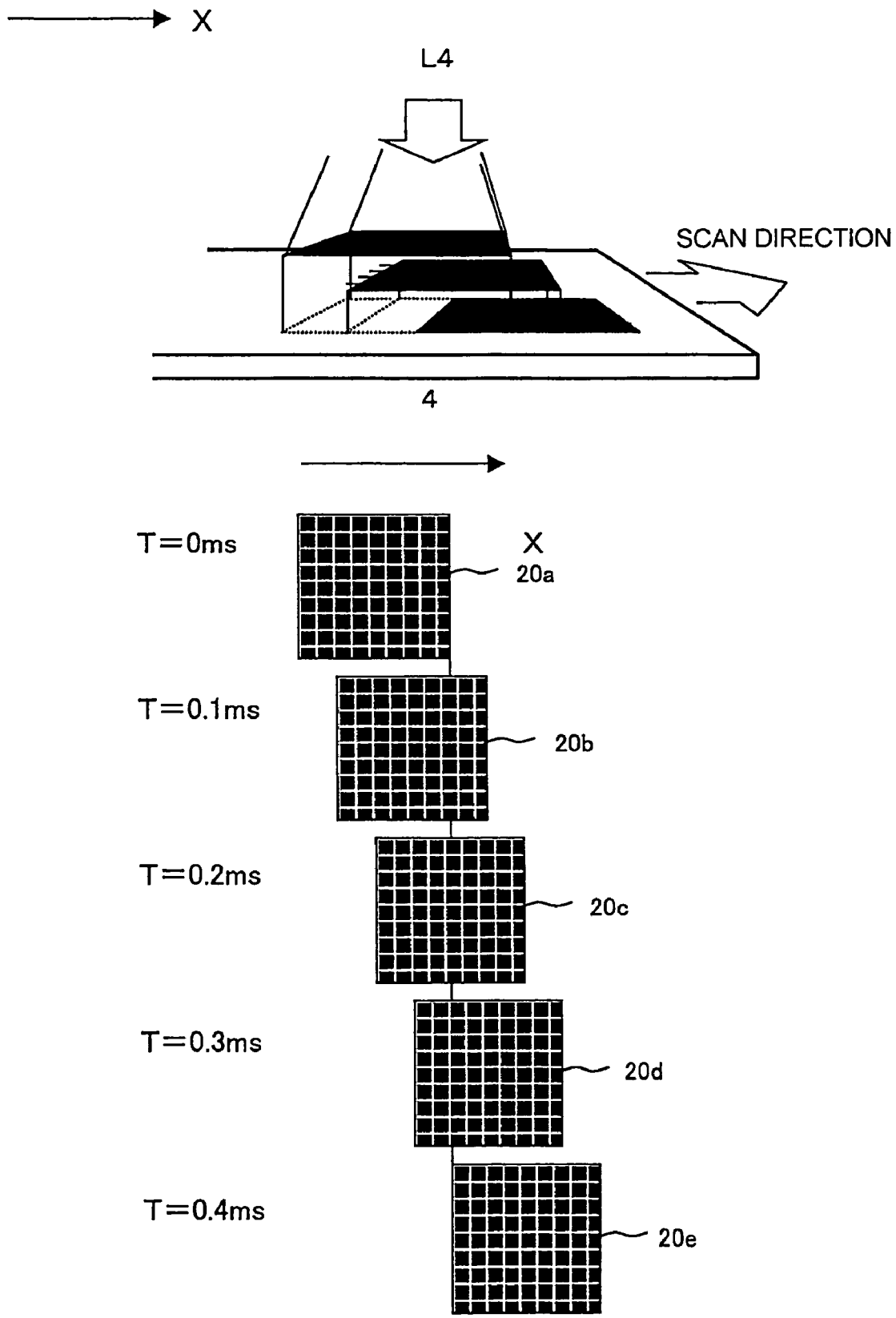
FIG. 19 is a diagram for explaining multiple exposure for applying a gray scale.
Figure 22:
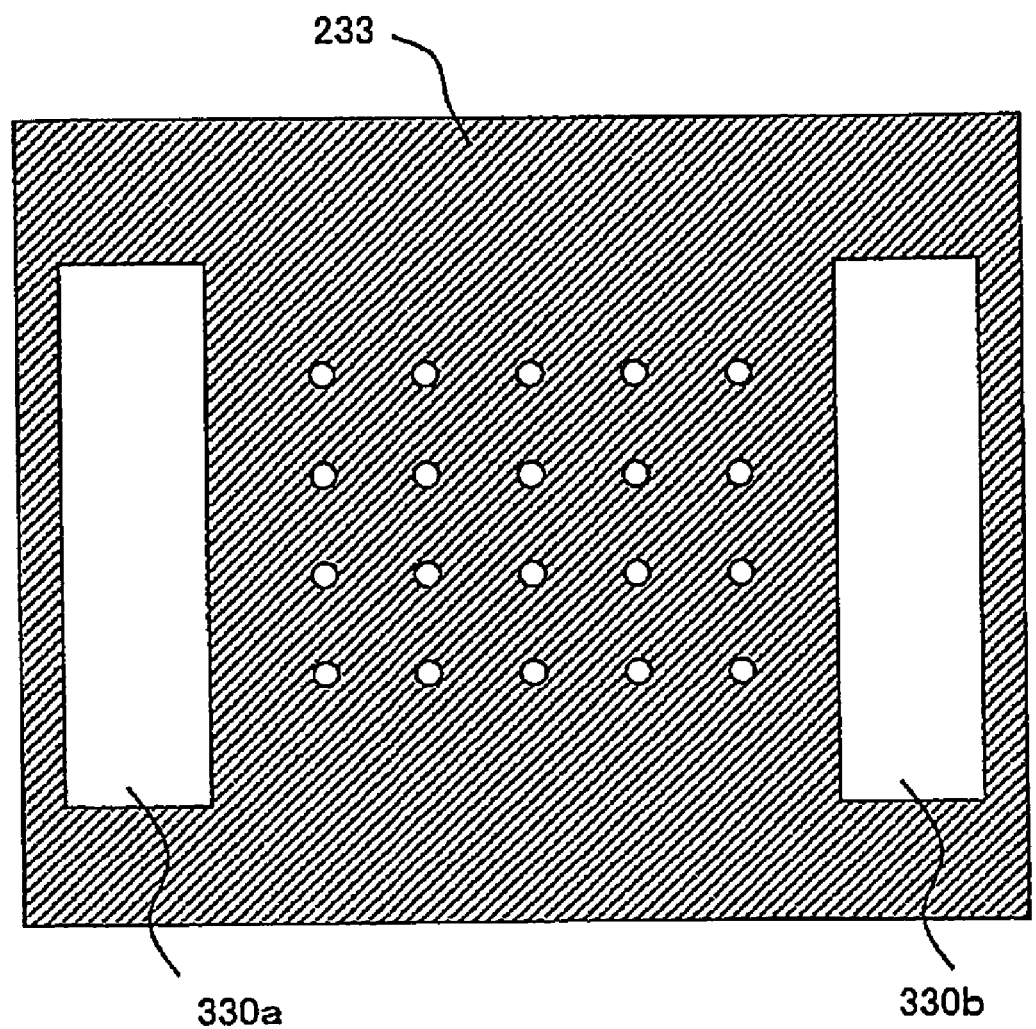
FIG. 22 is a diagram showing a structure of a pinhole plate used in the pattern writing system shown in FIG. 21.

Referring to FIGS. 18, 19, and 22, description will be made about a first example according to a third embodiment of this invention. FIG. 18 is a structural diagram of a pattern writing system 100 as the first example of this invention.

The pattern writing system 100 shown in FIG. 18 briefly comprises a mirror device 1, a reduction-projection optical system 2, an XY stage 3, and an ultraviolet pulse laser device 5 serving as an ultraviolet light source. The ultraviolet pulse laser device 5 uses, herein, the third harmonic of a YAG laser that implements repetitive pulse operation at 10000 Hz and pulse ultraviolet light L1 with a wavelength of 355 nm is extracted therefrom. The ultraviolet light L1 is reflected by mirrors 6a and 6b and passes through a shaping optical system 7 to be increased in its beam diameter, and then hits a half mirror 8. The half mirror 8 is configured to reflect about 98% so as to apply ultraviolet light L2 to the mirror device 1.

In the mirror device 1, 1024×768 (i.e. about 800000) micromirrors are herein arranged longitudinally and transversely at about a 14-micron pitch. Of the ultraviolet light applied to the mirror device 1, what is reflected and proceeds in a direction for use in exposure (i.e. what hits the ON-operating micromirrors and is reflected thereby in the mirror device 1) becomes ultraviolet light L3. The ultraviolet light L3 passes through the reduction-projection optical system 2 formed by many lenses and is irradiated onto a mask substrate 4 placed on the XY stage 3. That is, through the reduction-projection optical system 2, the plane of the mirror device 1 is reduction-projected onto the mask substrate 4 applied with an i-line resist. The mask substrate 4 is placed on the XY stage 3 so that, by scanning in X-direction and stepping in Y-direction, the irradiation position of ultraviolet light L4 having a projection pattern formed by the ON-micromirrors in the mirror device 1 can be moved over the whole area on the mask substrate 4, thereby enabling pattern writing over the whole surface of the mask substrate 4.

When transferring ON-patterns on the mirror device 1 onto the mask substrate 4, a gray scale as shown in FIG. 19 is used in this example. FIG. 19 shows the state where, following the movement of the mask substrate 4 in a scan direction (X-direction) on the XY stage 3 in FIG. 18, the ultraviolet light L4 is irradiated to a position, slightly offset per shot, on the mask substrate 4. In the pattern writing system 100, since, as described above, the pattern on the mirror device 1 is controlled at 10000 Hz frames, a new pattern is projected onto the mask substrate 4 per 0.1 ms. Therefore, FIG. 19 shows, in the lower part thereof, positions of projection patterns (20a, 20b, 20c, 20d, and 20e in sequence) per 0.1 ms.

In this example, the pattern projected onto the mask substrate 4 due to generation of the pulse ultraviolet light L1 moves a quarter of the size (width in X-direction) of the projection pattern per 0.1 ms. That is, in this example, the projection patterns overlap each other by three quarters of the area between frames and therefore the projection patterns overlap four times over the whole surface of the mask substrate 4. Therefore, four gradations can be obtained. Although, in this example, the case of four gradations is shown in the figure in order to facilitate the explanation, it is preferable to actually provide, for example, about 100 gradations where about 99/100 of the area overlaps between frames. According to this technique, the minimum grid can be reduced to about 1 nm.

In the conventional system, since the ultraviolet light L4 is the pulse laser light from the ultraviolet pulse laser device 5, the exposure amounts of the exposure patterns shown per time in the lower part of FIG. 19 have variation and cannot be precisely equalized, and therefore, it has been difficult to precisely reproduce the gray scale. In view of this, in this invention, as shown in FIG. 18, the ultraviolet light L2 is slightly transmitted through the half mirror 8 and its energy is measured by a photodetector 9. By this, energy data per pulse can be obtained and the number of spot overlapping times in the gray scale is corrected so as to take energy variation into account. That is, an energy value signal from the photodetector is transmitted to a gray scale correction device 10 through a signal line 11a, which calculates a gray scale adapted to correct energy variation and, based on the calculation result, controls ON/OFF operation of each micromirror in the mirror device 1 through a signal line 11b.

Figure 20:
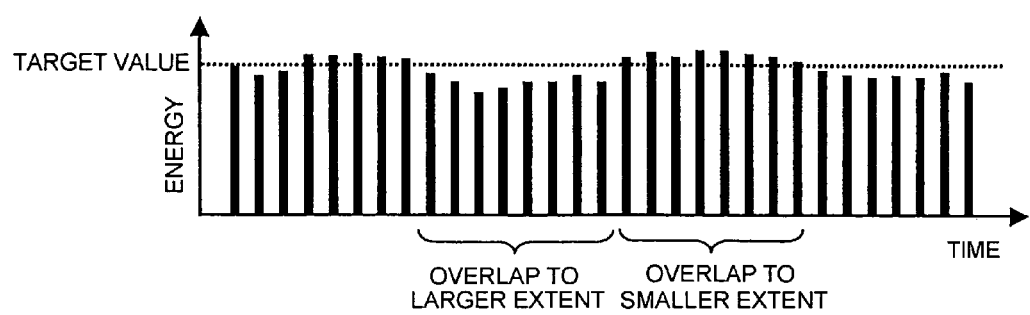
FIG. 20 is a diagram for explaining calculation of the multiplicity in a gray scale of this invention.

More specifically, as shown in FIG. 20, it is assumed that pulse energy of ultraviolet light differs per shot. In this case, by measuring energy values of pulses at all times, if, for example, there is produced a pulse train whose energy value is smaller than a target value, the number of spot overlapping times when reproducing the gray scale is corrected to increase, while, if there is produced a pulse train whose energy value is greater than the target value, the number of spot overlapping times when reproducing the gray scale is corrected to decrease.

In this invention, the gray scale is realized that is adapted for the minimum grid of about 1 nm. However, it is quite difficult to implement a position control of the mask substrate 4 with such a degree of accuracy by the use of the XY stage 3. Therefore, in this example, a fine position control of the mirror device 1 in several nm is executed by the use of piezoelectric elements, thereby controlling a pattern position projected onto the mask substrate 4. The reason is that since the movement amount of the pattern position projected onto the mask substrate 4 becomes smaller than the movement amount of the mirror device 1 by a reduction magnification of the reduction-projection optical system 2, the pattern position can be controlled delicately.

Figure 21:
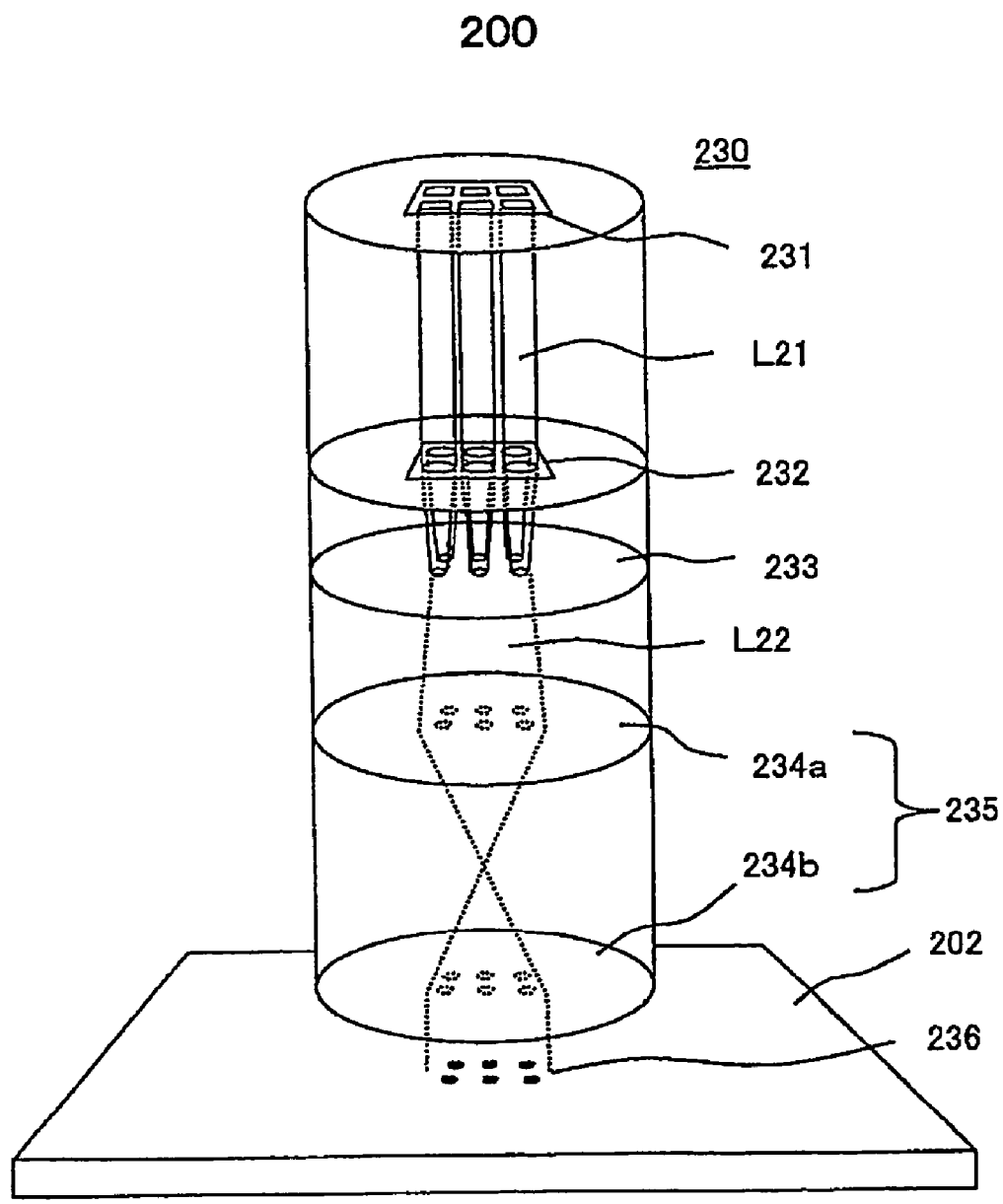
FIG. 21 is a diagram showing a structure of a pattern writing system according to a first example of a fourth embodiment of this invention.

Now, referring to FIG. 21, description will be made about an example according to a fourth embodiment of this invention. A pattern writing system 200 of this invention shown in FIG. 21 comprises a light pattern generating portion 230, a DMD 231 for receiving laser light supplied from a non-illustrated ultraviolet laser device and reflecting it, and a microlens array 232 for receiving reflected laser light L21. Further, the laser light L21 narrowed by passing through the microlens array 232 is condensed on a pinhole plate 233 and laser light L22 condensed at the pinhole plate 233 forms a DMD projection pattern 236 on a mother mask 202 through a reduction-projection optical system 235 in the form of lenses 234a and 234b.

Herein, the pinhole plate 233 is in the form of a quartz glass with a metal film formed thereon and the metal film has a large number of fine holes each having a diameter of about 1 µm. The fine holes of the pinhole plate 233 correspond to micromirrors of the DMD 231, respectively. The size of each micromirror in the DMD 231 is set to about 14 µm. In the illustrated example, as a light source used in the pattern writing system 200, use is made of the ultraviolet laser device that continuously oscillates at the fourth harmonic of a YAG laser with a wavelength of 266 nm. Therefore, the illustrated DMD 231 is preferably incorporated in an ultraviolet-adapted DMD drive mechanism. In this case, the ultraviolet-adapted DMD drive mechanism preferably comprises a structure for cooling the DMD 231 by circulating a gas or the like.

Further, referring to FIG. 22, as a member for improving the writing performance of the pattern writing system 200 shown in FIG. 21, the pinhole plate 233 will be described. In the pinhole plate 233 used in the light pattern generating portion 230 of the pattern writing system 200 shown in FIG. 21, the metal film having the holes each with the diameter of about one micron is formed on the quartz glass as described above. On the other hand, since the reduction magnification of the microlens array 232 is about 1/4, spots on the pinhole plate 233 each have a diameter of about 3.5 microns.

In the conventional system, the hole diameter of the pinhole plate 233 was set to 3.5 microns to thereby take out the laser light without waste. However, since the reduction magnification of the reduction-projection optical system 235 was about 1/5, the diameter of each of spots forming the DMD projection pattern 236 was about 0.7 microns. If the reduction magnification of the reduction-projection optical system 235 is increased, the spot diameter on the mother mask 202 can be reduced, but there has also been a problem that since the DMD projection pattern 236 itself is diminished in size, a writing time is resultantly prolonged.

On the other hand, in this invention, since the hole diameter in the pinhole plate 233 is about one micron, the diameter of each of the spots forming the DMD projection pattern 236 becomes about 0.2 micron so that a pattern finer than conventional can be formed without reduction in size of the DMD projection pattern 236 itself. However, since the diameter of each spot condensed by the microlens array 232 is about 3.5 microns, the rate of the amount of laser light that can exit the hole of about one micron in the pinhole plate 233 is about 8% and, therefore, as much as about 92% of the laser light is used for heating the pinhole plate 233.

In view of this, in this embodiment, Peltier elements 330a and 330b are formed on both sides of an array of the pinholes in the pinhole plate 233 to thereby forcibly cool the pinhole plate 233 during exposure. Note that the surface where the Peltier elements 330a and 330b are formed is the surface where the foregoing metal film is formed in the pinhole plate 233. This is because since the thermal conductivity of the metal film is large, the effect of cooling the whole pinhole plate 233 is enhanced by the Peltier elements 330a and 330b.

As described above, in the pattern writing system 200 of this invention, since the pinhole plate 233 can be cooled during exposure, the pinhole plate 233 does not largely increase in temperature and thus does not largely increase in thermal expansion. Therefore, the relative positions of the respective pinholes do not largely deviate during exposure so that the DMD projection pattern 236 is precisely projected at a position pursuant to a design in the mother mask 202.

As described above, in the pattern writing system 200 according to this invention, since, particularly, the pinhole plate 233 having the sufficiently fine holes of about one micron can be used without increasing the reduction magnification of the microlens array 232, even when the spot diameter in the pattern of the DMD 231 can be reduced to about 0.2 microns, it is possible to use the low magnification like the reduction magnification of about 1/4 to 1/5 for the reduction-projection optical system 235.

According to this structure, use can be made, as the reduction-projection optical system 235, of a reduction-projection optical system in a normal i-line exposure system or a reduction-projection optical system in a KrF exposure system.

Since these exposure systems are mass-produced by exposure system makers, the reduction-projection optical system can be obtained at a low price so that the pattern writing system 210 can be manufactured at a low cost. It is well known that the reduction magnification of the reduction-projection optical system in the i-line exposure system is 1/5 and the reduction magnification of the reduction-projection optical system in the KrF exposure system is 1/4. However, the reduction magnification of each of these reduction-projection optical systems is not precisely 1/4 or 1/5, but is generally adjustable between 1/3.5 and 1/4.5 or between 1/4.5 and 1/5.5. Therefore, in this invention, it is possible to achieve a reduction in cost of the system particularly by the use of the reduction-projection optical system for the exposure system.

Figure 23:
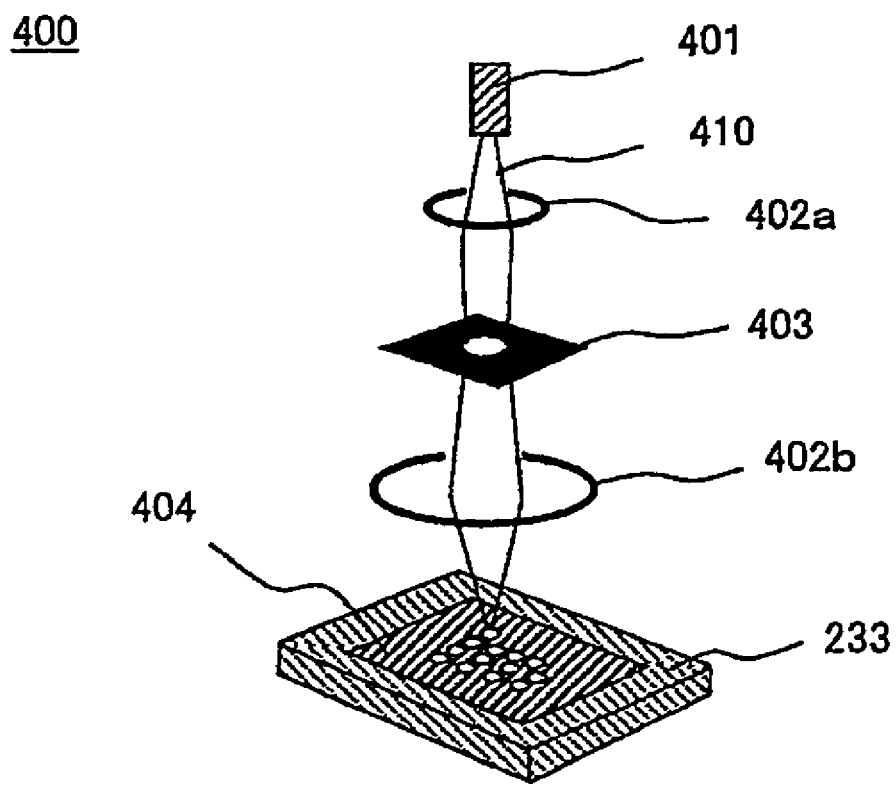
FIG. 23 is a diagram for explaining a technique of manufacturing the pinhole plate.

Now, referring to FIG. 23, description will be made about a technique of manufacturing the pinhole plate 233 of this embodiment. The pinhole plate 233 of this embodiment is in the form of a quartz glass serving as a substrate with a metal film formed thereon. The metal film is suitably copper, aluminum, gold, or the like having a high thermal conductivity. Particularly, copper is most preferable because it can also be attached by plating and thus has a feature of enabling the manufacture at a low cost.

It is preferable to use an electron-beam exposure system 400 in order to form a hole in the metal film. In the electron-beam exposure system 400, accelerated electrons 410 emitted from an electron gun 401 proceed while being slightly narrowed by an electron lens 402a and hit an aperture 403 formed with a round hole. The electrons passing through the hole of the aperture 403 are reduction-projected through an electron lens 402b onto the pinhole plate 233 (the quartz glass with the metal film at this time instant because no pinholes are formed yet) applied with a resist 404 so that the resist 404 is exposed in the shape of a hole. After completion of the exposure with respect to all holes, the pinhole plate 233 applied with the resist 404 is developed and further wet-etched so that a large number of fine holes can be formed in the metal film.

The reason for using the electron-beam exposure system 400 in order to form the holes in the metal film as described above is that since the electron beam can correct in an instant a slight distance of several nanometers by the use of the electron lens 402b, it is possible to implement spot exposure on the substrate with a high position accuracy of several nanometers or less.

Figure 24:
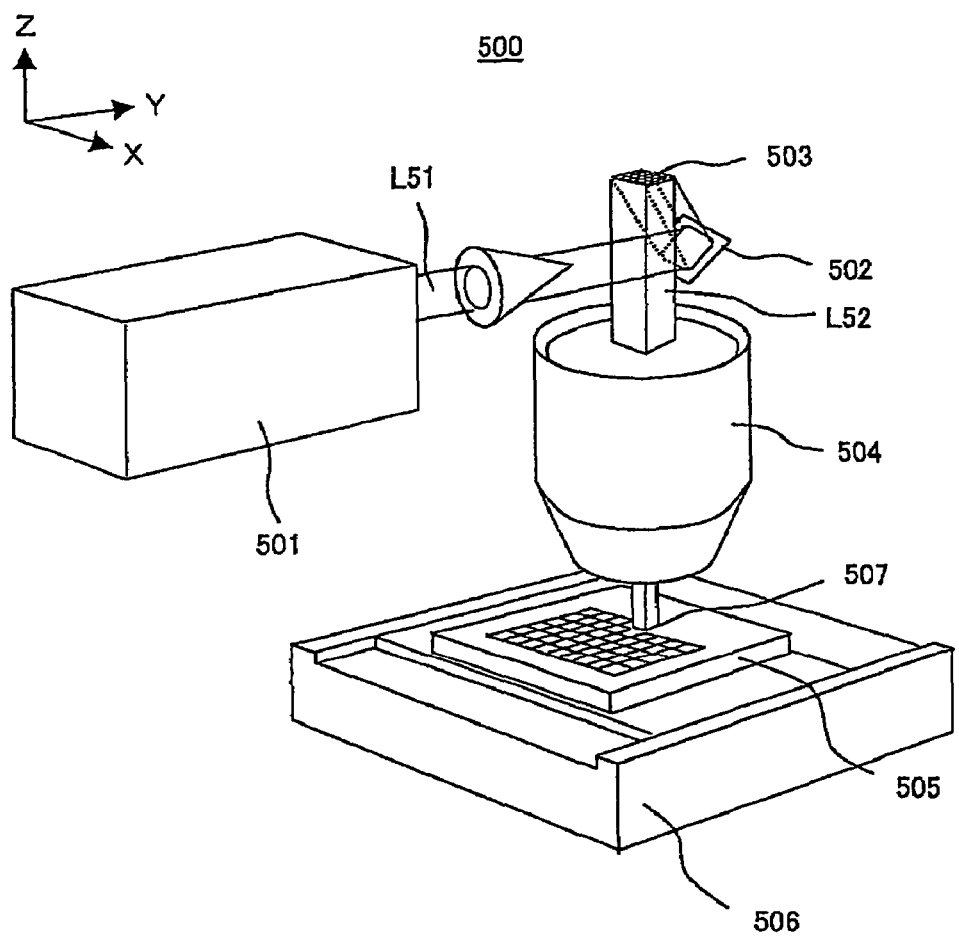
FIG. 24 is a diagram showing a pattern writing system according to the fourth embodiment of this invention.

Now, referring to FIGS. 24 and 25, description will be made about a writing technique of this invention in a pattern writing system in which a pattern of a DMD is directly reduction-projected. FIG. 25 is an explanatory diagram showing, in time sequence from (a) to (l), projecting positions of a DMD projection pattern 507 on a substrate 505 when a pulse laser device 501 and a DMD 503 are operated at 10,000 Hz, wherein the number of projected micromirrors is shown reduced in order to facilitate understanding. The DMD projection pattern 507 projected onto the substrate 505 is indicated by hatching. As seen from the figure, the DMD projection pattern 507 projected in X-direction per 0.1 ms is projected so as to partly overlap in X-direction by scanning of the substrate 505. On the other hand, by stepping in Y-direction in an XY stage 506, projection is implemented while partly overlapping in transfer also in Y-direction. For example, (a), (e), and (i) are overlapped in transfer in Y-direction. In this invention, the transfer of the DMD projection pattern 507 is overlapped in X and Y two directions as described above, thereby realizing a gray scale. As a result, errors in both scan and step positions are averaged to make unnecessary the joint exposure in the step direction so that no abnormal exposure occurs.

INDUSTRIAL APPLICABILITY

As described above, this invention is applicable to a mask writing system for fabricating a mask for use in an exposure process at the time of manufacturing a semiconductor integrated circuit, a maskless exposure system for directly writing a wafer, and so on.

According to a pattern writing system of this invention, since gradations can be achieved without executing a delicate voltage control for a mirror device, not only writing can be implemented with high accuracy and at high speed but also intermediate amounts of light can be produced precisely and without malfunction.

The invention claimed is:

1. A pattern writing system including a pulse laser light generating portion and two-dimensionally arranged micromirrors and reduction-projecting said micromirrors onto a substrate, said pattern writing system comprising:
    means for generating pulse laser light;
    means for performing pattern transfer while overlapping, in both of two perpendicular moving directions on said substrate, projection patterns of said two-dimensionally arranged micromirrors, each projected onto said substrate by one-time pulse laser light; and
    a pinhole plate that can divide, into a large number of fine light beams, the pulse laser light from the pulse light source applied to a mirror device including said micromirrors,
    wherein said pinhole plate has a first Peltier element provided on one side of a first surface and a second Peltier element provided on another side of the first surface opposite the one side.

2. A pattern wiring system according to claim 1, wherein the pinhole plate comprises a quartz glass and a metal plate which is formed on a surface of the quartz glass and which has a plurality of pinholes formed on the metal plate, the first and second Peltier elements being attached to the metal plate.

* * * * *